(12) United States Patent
Ho

(10) Patent No.: US 11,133,319 B2
(45) Date of Patent: Sep. 28, 2021

(54) SEMICONDUCTOR DEVICE AND METHOD FOR FABRICATING THE SAME

(71) Applicant: NANYA TECHNOLOGY CORPORATION, New Taipei (TW)

(72) Inventor: Jar-Ming Ho, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 80 days.

(21) Appl. No.: 16/578,782

(22) Filed: Sep. 23, 2019

(65) Prior Publication Data
US 2021/0091089 A1    Mar. 25, 2021

(51) Int. Cl.
*H01L 27/10* (2006.01)
*H01L 27/108* (2006.01)
*H01L 23/522* (2006.01)

(52) U.S. Cl.
CPC .... *H01L 27/10888* (2013.01); *H01L 23/5226* (2013.01); *H01L 27/10885* (2013.01); *H01L 27/10814* (2013.01)

(58) Field of Classification Search
CPC ......... H01L 27/10888; H01L 27/10891; H01L 23/5226; H01L 27/10885; H01L 27/10855; H01L 23/528; H01L 23/53271; H01L 27/10811; H01L 27/10814
USPC .................. 257/296; 438/238, 239, 386, 399
See application file for complete search history.

(56) References Cited

U.S. PATENT DOCUMENTS

| | | | | |
|---|---|---|---|---|
| 5,920,783 A | * | 7/1999 | Tseng | H01L 21/28518 438/305 |
| 8,957,467 B2 | | 2/2015 | Uchiyama | |
| 2004/0191930 A1 | * | 9/2004 | Son | H01L 28/55 438/3 |
| 2007/0249133 A1 | * | 10/2007 | Bronner | H01L 27/11 438/305 |
| 2008/0121960 A1 | * | 5/2008 | Ohuchi | H01L 27/10855 257/296 |

OTHER PUBLICATIONS

Office Action dated May 26, 2021 in TW Application No. 109116567, 13 pages.

\* cited by examiner

*Primary Examiner* — Didarul A Mazumder
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate; a plurality of landing pads disposed over the substrate, at least one of the plurality of landing pads comprising a protruding portion of a capacitor plug and a first spacer over the protruding portion, wherein a width of the first spacer is larger than a width of the capacitor plug; a plurality of bit line contacts disposed over the substrate and a plurality of bit lines respectively disposed over the plurality of bit line contacts. The bit line is an undulating stripe extending between two adjacent capacitor contacts; and a plurality of capacitor structures respectively disposed over the plurality of landing pads.

9 Claims, 37 Drawing Sheets

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device with coverage layer and a method for fabricating the semiconductor device with coverage layer.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the increasing demand of computing ability. However, a variety of issues arise during the scaling-down process and impact the final electrical characteristics, quality, and yield. Therefore, challenges remain in achieving improved performance, quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device, comprising: a substrate; a plurality of landing pads disposed over the substrate, at least one of the plurality of landing pads comprising a protruding portion of a capacitor plug and a first spacer over the protruding portion, wherein a width of the first spacer is larger than a width of the capacitor plug; a plurality of bit line contacts disposed over the substrate and a plurality of bit lines respectively disposed over the plurality of bit line contacts, wherein at least one of the plurality of bit lines is an undulating stripe extending between two adjacent capacitor contacts; and a plurality of capacitor structures respectively disposed over the plurality of landing pads.

In some embodiments, the first spacer comprises metal silicide and is disposed on a sidewall of the protruding portion.

In some embodiments, the first spacer comprises polysilicon and is disposed on a sidewall of the protruding portion.

In some embodiments, the semiconductor device further comprises a second spacer disposed over the first spacer.

In some embodiments, the second spacer comprises metal silicide.

In some embodiments, the semiconductor device further comprises a plurality of capacitor contacts positioned over the substrate, the landing pads are disposed over the plurality of capacitor contacts, at least one of the plurality of capacitor contacts having a neck portion and a head portion over the neck portion, wherein an upper width of the head portion is larger than an upper width of the neck portion;

In some embodiments, the upper width of the head portion is larger than a bottom width of the head portion.

In some embodiments, the upper width of the neck portion is substantially the same as a bottom width of the head portion.

In some embodiments, the head portion has a curved sidewall.

In some embodiments, the head portion has tapered profile.

Another aspect of the present disclosure provides a method for fabricating a semiconductor device, comprising: providing a substrate including a plurality of first regions and second regions; forming a plurality of bit line contacts over the first regions of the substrate; forming a plurality of bit lines respectively over the plurality of bit line contacts; forming a plurality of capacitor contacts respectively over the second regions of the substrate; forming a plurality of capacitor plugs respectively over the plurality of capacitor contacts; forming a plurality of first spacers respectively over a plurality of protruding portions of the plurality of capacitor plugs, wherein a width of the first spacer is larger than a width of the capacitor plug; and forming a plurality of capacitor structures over the plurality of first spacers; wherein at least one of the plurality of bit lines is an undulating stripe extending between two adjacent capacitor contacts.

In some embodiments, the first spacer comprises metal silicide and is formed on a sidewall of the protruding portion.

In some embodiments, the first spacer comprises polysilicon and is disposed on a sidewall of the protruding portion.

In some embodiments, the method for fabricating a semiconductor device further comprises: forming a plurality of second spacers respectively over the plurality of first spacers.

In some embodiments, the second spacer comprises metal silicide.

In some embodiments, the method for fabricating a semiconductor device further comprises: a plurality of capacitor contacts positioned over the substrate, the plurality of first spacers are formed over the plurality of capacitor contacts, at least one of the plurality of capacitor contacts having a neck portion and a head portion over the neck portion, wherein an upper width of the head portion is larger than an upper width of the neck portion.

In some embodiments, forming a plurality of capacitor contacts comprise: forming a contact hole in a dielectric stack having a first layer and a second layer over the first layer; removing a portion of the second layer around the contact hole to form a transformed hole having a narrow portion in the first layer and a wide portion in the second layer; and filling a conductive material into the transformed hole.

In some embodiments, the contact hole is formed integrally with a bit line trench in the second layer.

In some embodiments, the method for fabricating a semiconductor device further comprises: filling the bit line trench and a lower portion of the contact hole with a filling material.

In some embodiments, removing a portion of the second layer around the contact hole is performed after filling the lower portion of the contact hole with a sacrificial material.

Due to the landing pad having the first spacer, wherein a width of the first spacer is larger than a width of the capacitor plug, the misalignment between the subsequently formed capacitor structure and the landing pad can be dramatically solved, wherein a width of the first spacer is larger than a width of the capacitor plug.

In addition, due to the capacitor contact having the neck portion and the head portion with a tapered profile, the misalignment between the subsequently formed capacitor structure and the capacitor contact can be dramatically solved. In addition, the coverage layer may reduce formation of defects in the semiconductor device; therefore, the yield of the semiconductor device increases correspondingly.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
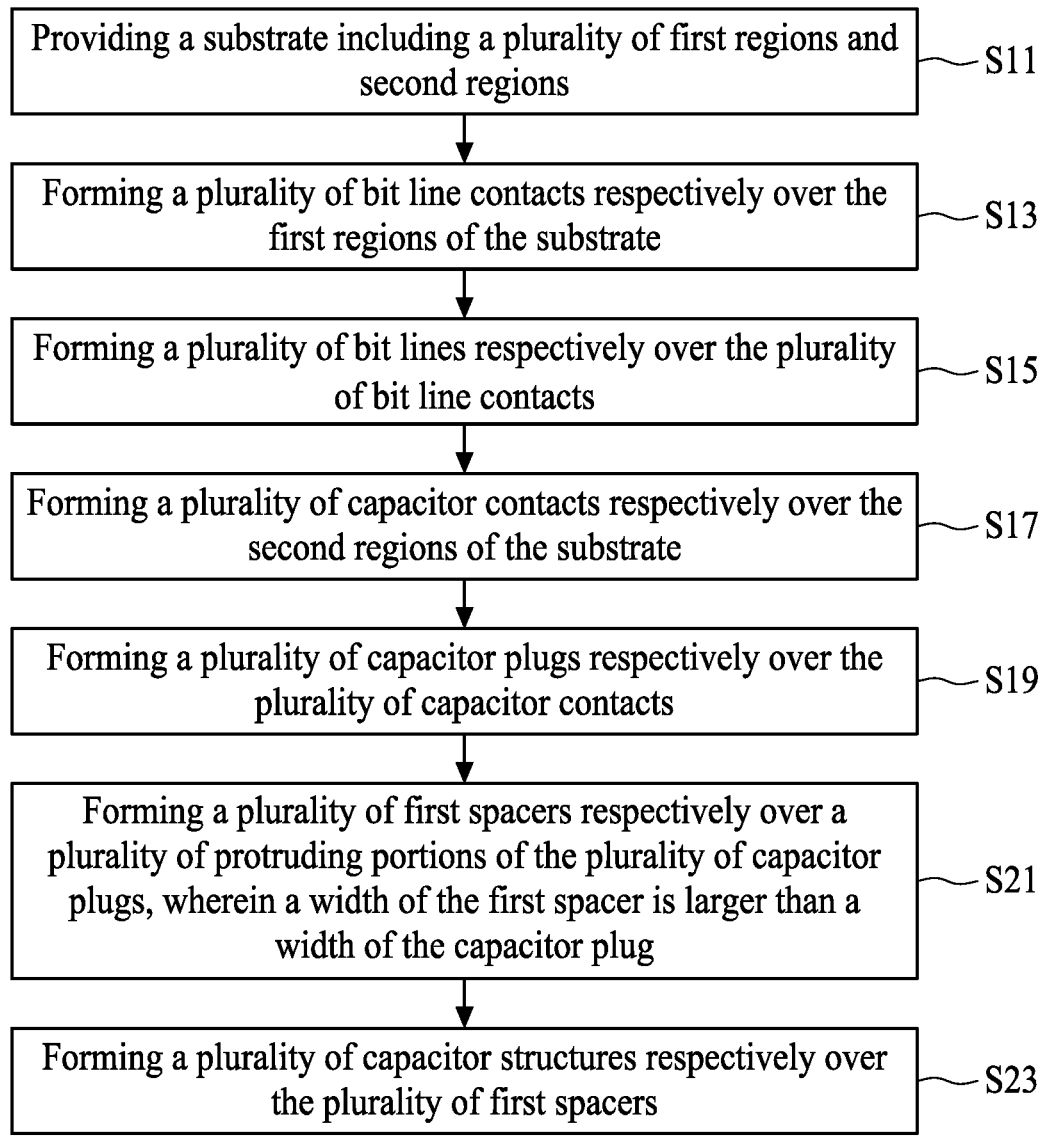
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

Note that, in the description of the present disclosure, above (or up) corresponds to the direction of the arrow of the direction Z, and below (or down) corresponds to the opposite direction of the arrow of the direction Z.

Figure 2:
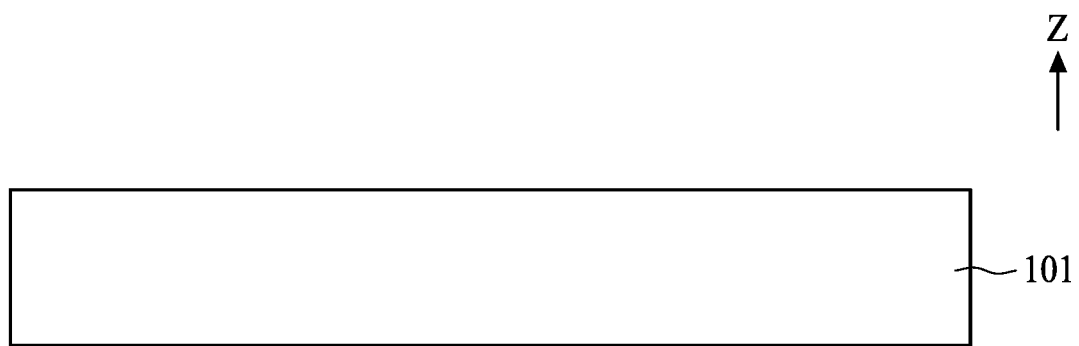
FIGS. 2 and 3 illustrate, in schematic cross-sectional diagrams, part of a flow of fabricating a semiconductor device in accordance with one embodiment of the present disclosure.
Figure 3:
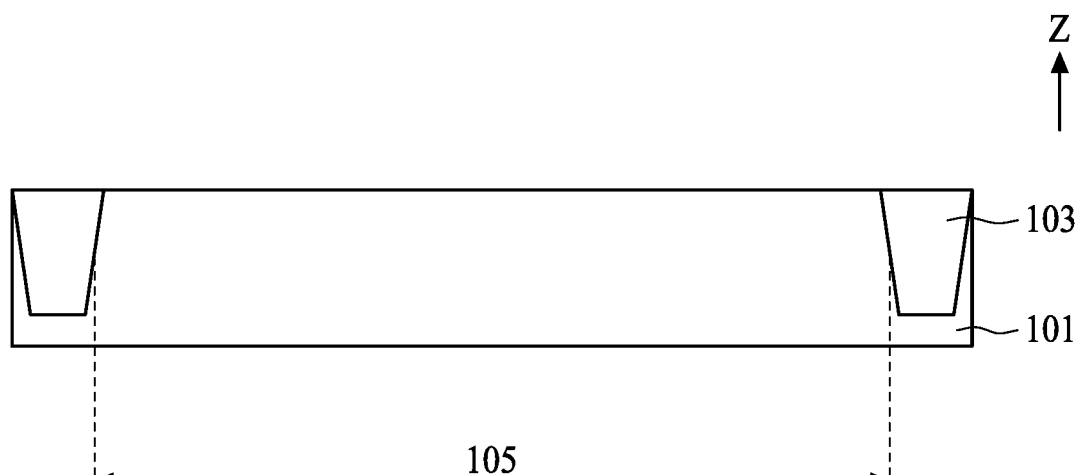
Figure 4:
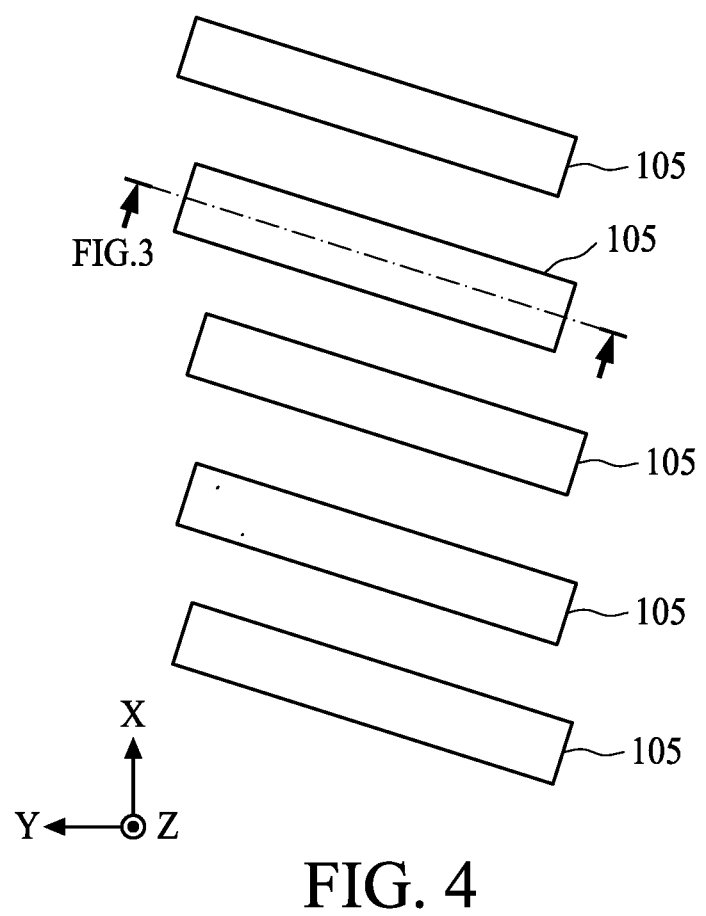
FIG. 4 illustrates, in a schematic top-view diagram, the semiconductor device in accordance with FIG. 3.

FIG. 1 illustrates, in a flowchart diagram form, a method 10 for fabricating a semiconductor device in accordance with one embodiment of the present disclosure. FIGS. 2 and 3 illustrate, in schematic cross-sectional diagrams, part of a flow of fabricating a semiconductor device in accordance with one embodiment of the present disclosure. FIG. 4 illustrates, in a schematic top-view diagram, the semiconductor device in accordance with FIG. 3.

With reference to FIGS. 1 and 2, at step S11, a substrate 101 may be provided, and a plurality of first regions and second regions are formed in the substrate. The substrate 101 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide.

With reference to FIGS. 3 and 4, a plurality of isolation structures 103 may be formed in the substrate 101. The plurality of isolation structures 103 are separated from each other in a cross-sectional view and define a plurality of active regions 105. The plurality of isolation structures 103 may be formed of, for example, an insulating material such as silicon oxide, silicon nitride, silicon oxynitride, silicon nitride oxide, fluoride-doped silicate, or the like. The plurality of active regions 105 may extend in a direction slanted with respect to a direction X in a top-view diagram. Note that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 5:
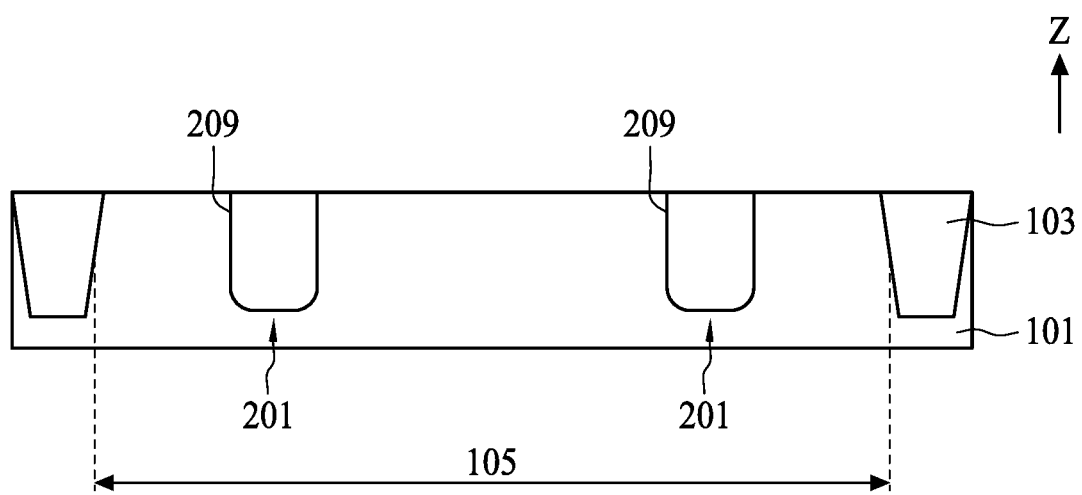
FIGS. 5 to 7 illustrate, in schematic cross-sectional diagrams, part of the flow of fabricating the semiconductor device in accordance with one embodiment of the present disclosure.
Figure 6:
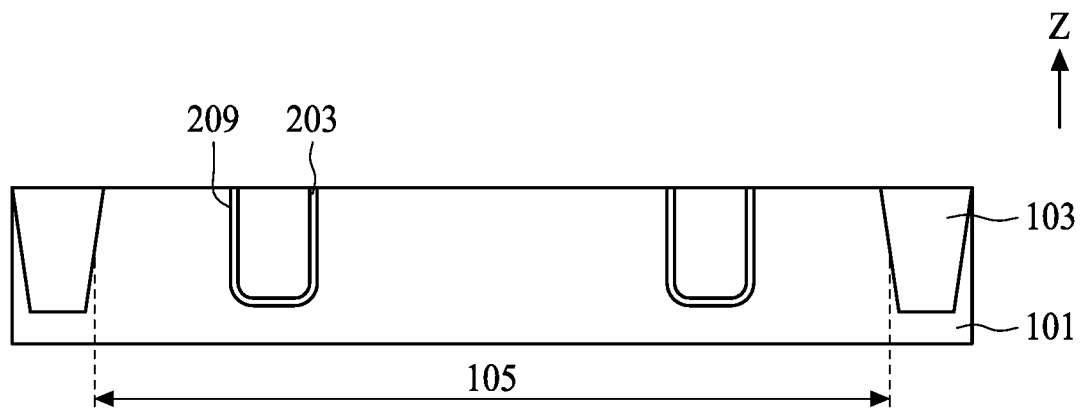
Figure 7:
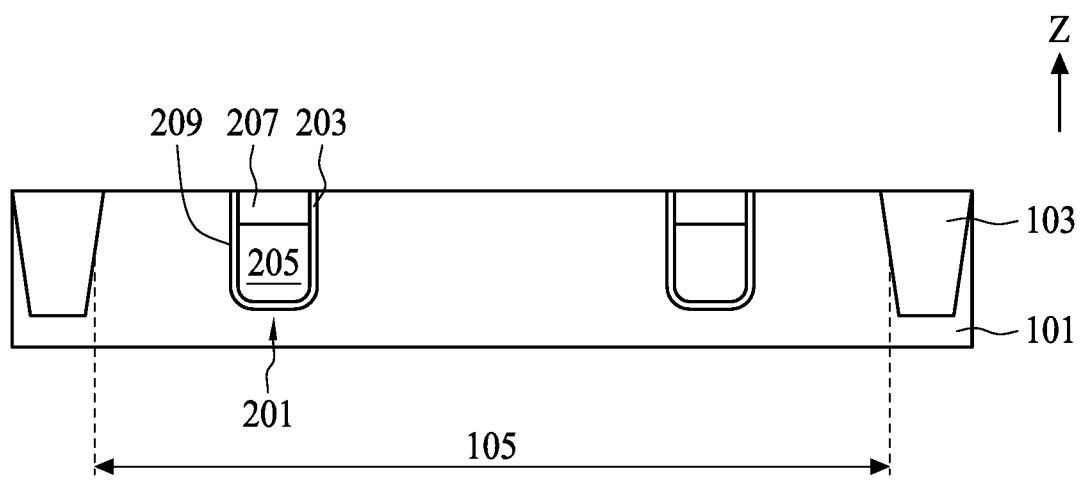
Figure 8:
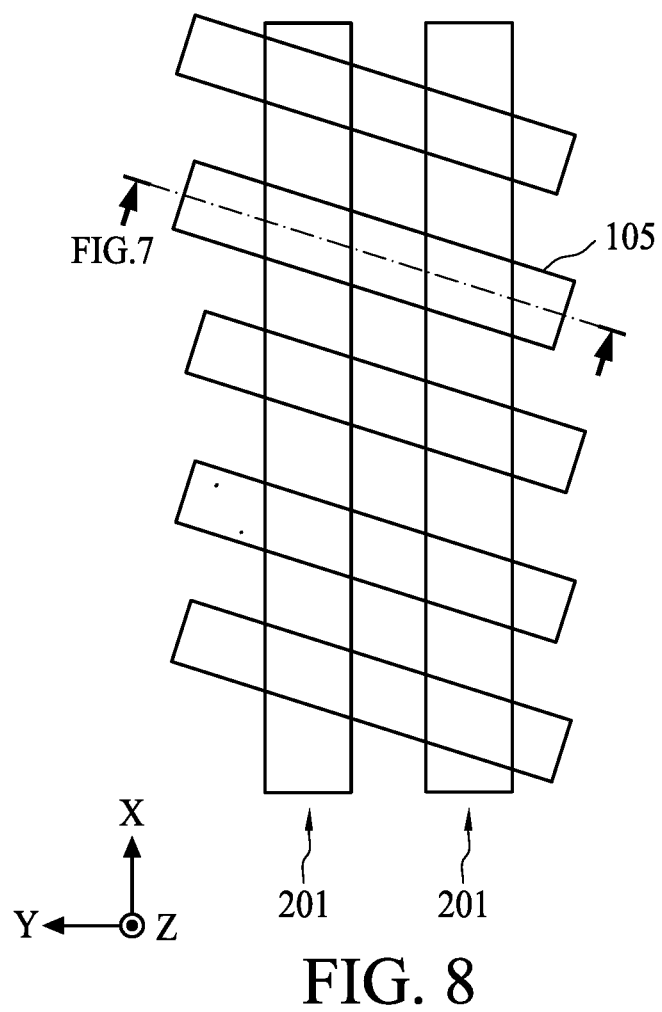
FIG. 8 illustrates, in a schematic top-view diagram, the semiconductor device in accordance with FIG. 7.

FIGS. 5 to 7 illustrate, in schematic cross-sectional diagrams, part of the flow of fabricating the semiconductor device in accordance with one embodiment of the present disclosure. FIG. 8 illustrates, in a schematic top-view diagram, the semiconductor device in accordance with FIG. 7.

With reference to FIG. 1 and FIGS. 5 to 8, a plurality of word lines 201 may be formed in the substrate 101. In the embodiment depicted, the plurality of word lines 201 may extend along the direction X. Each one of the plurality of word lines 201 includes a bottom layer 203, a middle layer 205, a top layer 207, and a trench opening 209. With reference to FIG. 5, in the embodiment depicted, a photolithography process may be used to pattern the substrate 101 to define positions of a plurality of trench openings 209. An etch process, such as an anisotropic dry etch process, may be performed to form the plurality of trench openings 209 in the substrate 101. With reference to FIG. 6, after the etch process, the plurality of bottom layers 203 may be correspondingly formed and attached to sidewalls of the plurality of trench openings 209 and bottoms of the plurality of trench openings 209. The plurality of bottom layers 203 may be formed of, for example, silicon oxide, silicon oxynitride, silicon nitride oxide, silicon nitride, or the like.

With reference to FIGS. 7 and 8, the plurality of middle layers 205 may be correspondingly formed on the plurality of bottom layers 203. Top surfaces of the plurality of middle layers 205 may be lower than a top surface of the substrate 101. The plurality of middle layers 205 may be formed of, for example, doped polysilicon, metal material, or metal silicide. Metal silicide may be, for example, nickel silicide, platinum silicide, titanium silicide, molybdenum silicide, cobalt silicide, tantalum silicide, tungsten silicide, or the like. The plurality of top layers 207 may be correspondingly formed on the plurality of middle layers 205. Top surfaces of the plurality of top layers 207 may be at the same vertical level as the top surface of the substrate 101. The plurality of top layers 207 may be formed of, for example, silicon oxide, silicon oxynitride, silicon nitride oxide, silicon nitride, or the like.

Figure 9:
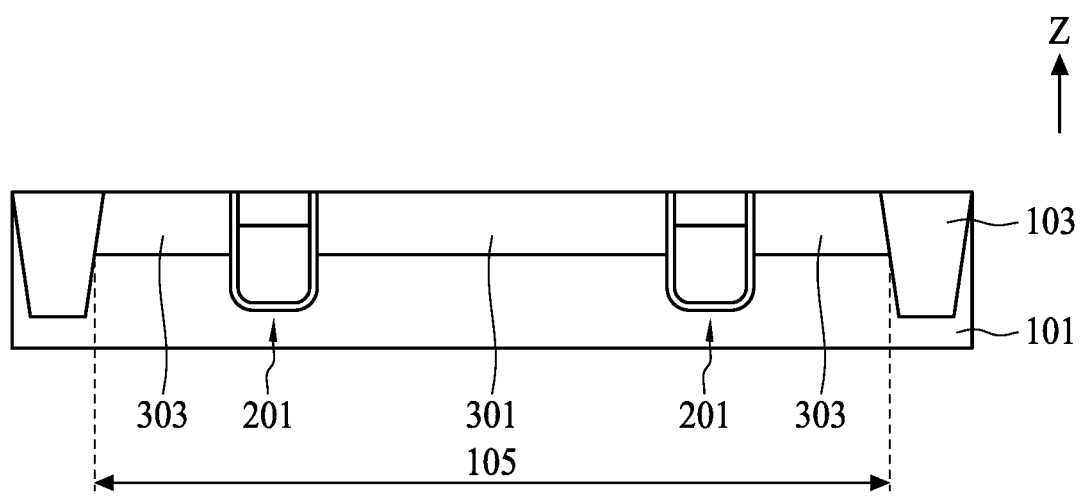
FIG. 9 illustrates, in a schematic cross-sectional diagram, part of the flow of fabricating the semiconductor device in accordance with one embodiment of the present disclosure.

FIG. 9 illustrates, in a schematic cross-sectional diagram, part of the flow of fabricating the semiconductor device in accordance with one embodiment of the present disclosure.

With reference to FIG. 1 and FIG. 9, a plurality of first regions and second regions may be formed in the plurality of active regions 105 of the substrate 101. The plurality of doped regions may include a first doped region 301 and second doped regions 303. The first doped region 301 is disposed between an adjacent pair of the plurality of word lines 201. The second doped regions 303 are respectively disposed between the plurality of isolation structures 103 and the plurality of word lines 201. The first doped region 301 and the second doped regions 303 are respectively doped with a dopant such as phosphorus, arsenic, or antimony. The first doped region 301 and the second doped regions respectively have dopant concentrations ranging from about 1E17 atoms/cm$^3$ to about 1E19 atoms/cm$^3$.

Figure 10:
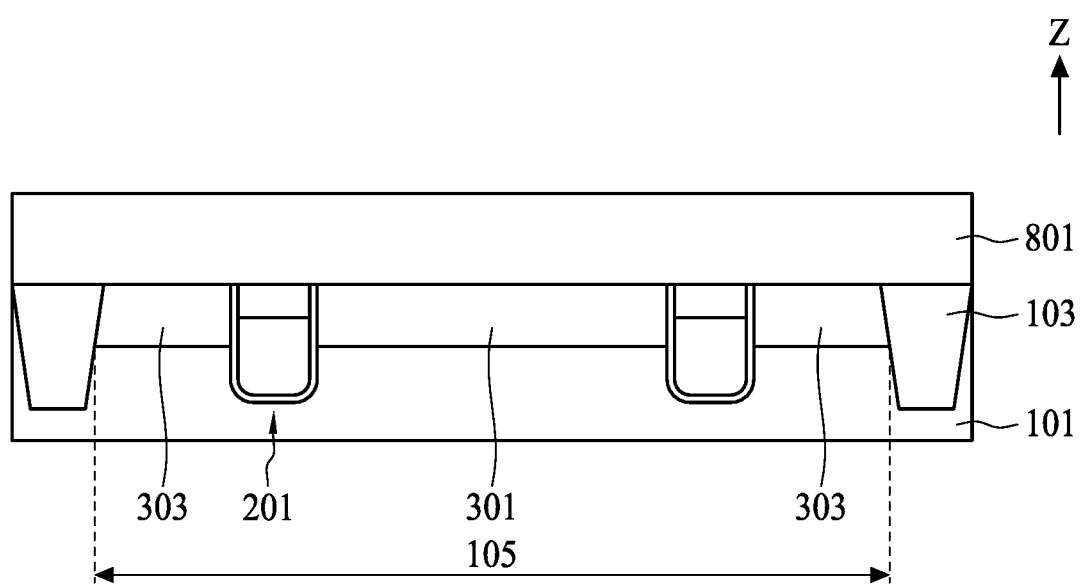
FIG. 10 illustrates, in a schematic cross-sectional diagram, part of the flow of fabricating the semiconductor device in accordance with one embodiment of the present disclosure.
Figure 11:
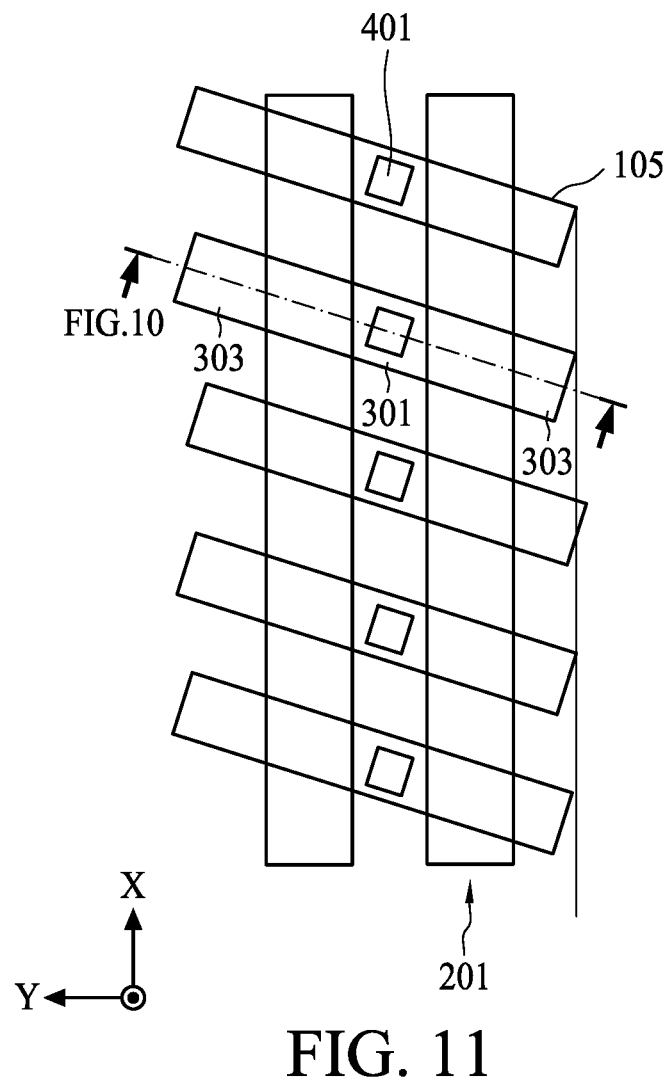
FIG. 11 illustrates, in a schematic top-view diagram, the semiconductor device in accordance with FIG. 10.

FIG. 10 illustrates, in a schematic cross-sectional diagram, part of the flow of fabricating the semiconductor device in accordance with one embodiment of the present disclosure. FIG. 11 illustrates, in a schematic top-view diagram, the semiconductor device in accordance with FIG. 10.

With reference to FIG. 1 and FIGS. 10 and 11, at step S13, a plurality of bit line contacts may be formed above the substrate. A first insulating film 801 may be formed on the substrate 101. The first insulating film 801 may be formed of, for example, silicon nitride, silicon oxide, silicon oxynitride, undoped silica glass, borosilica glass, phosphosilica glass, borophosphosilica glass, or a combination thereof, but is not limited thereto. The plurality of contacts 401 may be formed in the first insulating film 801. A photolithography process may be used to pattern the first insulating film 801 to define positions of the plurality of contacts 401. An etch process, such as an anisotropic dry etch process, may be performed after the photolithography process to form a plurality of openings in the first insulating film 801. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the plurality of openings to form the plurality of contacts 401. A planarization process, such as chemical mechanical polishing, may be performed after the metallization process to remove excess deposited material and provide a substantially flat surface for subsequent processing steps.

In some embodiments, with reference to FIGS. 10 and 11, the contact 401 is disposed on the first doped region 301 and is electrically connected to the first doped region 301. In the embodiment depicted, the contact 401 is formed including tungsten. Defects may be easily formed on a top surface of the contact 401 formed including tungsten when the top surface of the contact 401 is exposed to oxygen or air. The defects may affect the yield of the semiconductor device.

Figure 12:
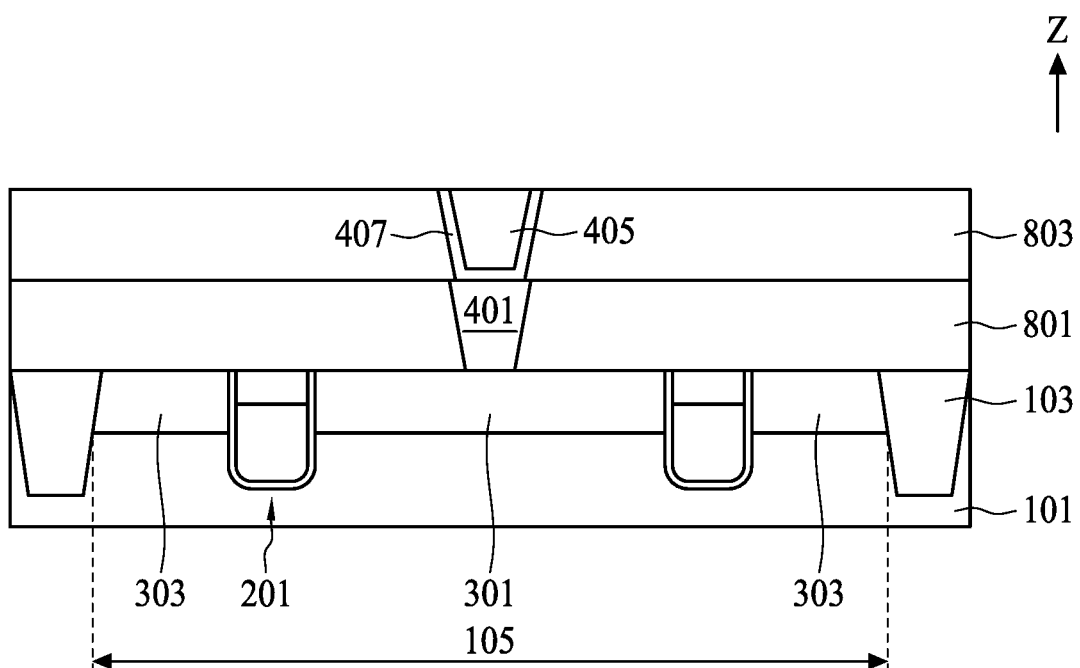
FIG. 12 illustrates, in a schematic cross-sectional diagram, part of the flow of fabricating the semiconductor device in accordance with one embodiment of the present disclosure.
Figure 13:
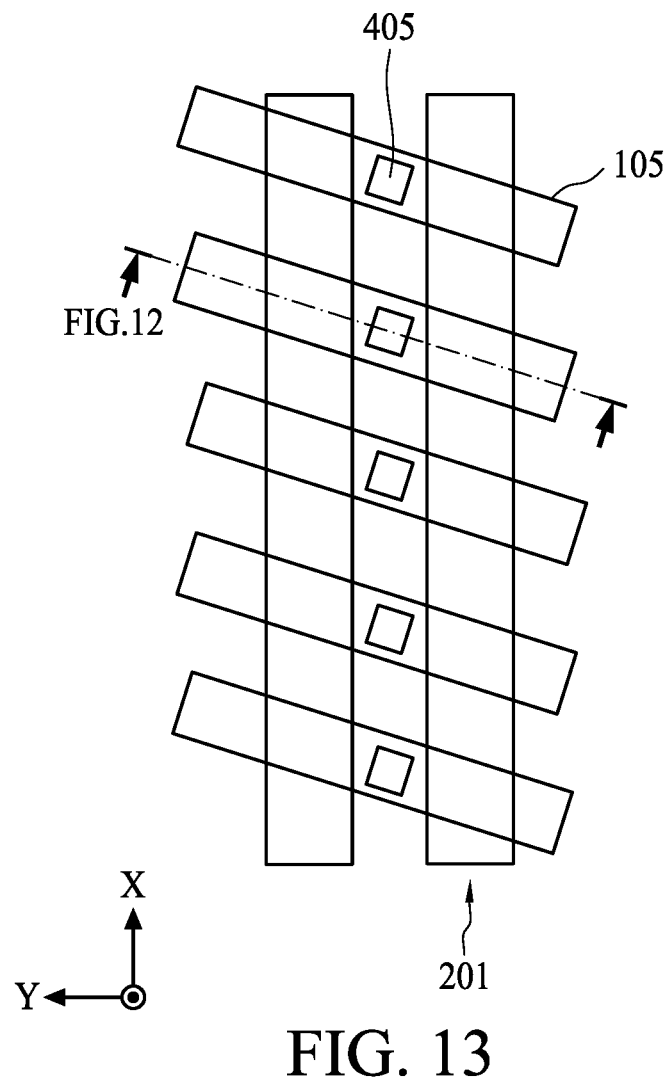
FIG. 13 illustrates, in a schematic top-view diagram, the semiconductor device in accordance with FIG. 12.

FIG. 12 illustrates, in a schematic cross-sectional diagram, part of the flow of fabricating the semiconductor device in accordance with one embodiment of the present disclosure. FIG. 13 illustrates, in a schematic top-view diagram, the semiconductor device in accordance with FIG. 12.

With reference to FIG. 1 and FIGS. 12 and 13, a plurality of bit line contacts 405 may be formed above the substrate 101. (Only one bit line contact 405 is shown in FIG. 12.) A second insulating film 803 may be formed on the first insulating film 801. The second insulating film 803 may be formed of a same material as the material of the first insulating film 801, but is not limited thereto. A photolithography process may be used to pattern the second insulating film 803 to define positions of the plurality of bit line contacts 405. An etch process, such as an anisotropic dry etch process, may be performed after the photolithography process to form a plurality of bit line contact openings in the second insulating film 803. A top surface of the contact 401 may be exposed through the plurality of bit line contact openings. A cleaning process using a reducing agent may be optionally performed to remove the defects on the top surface of the contact 401 formed including tungsten. The reducing agent may be titanium tetrachloride, tantalum tetrachloride, or a combination thereof.

With reference to FIGS. 12 and 13, after the cleaning process, a first coverage layer 407 including tungsten nitride may be formed to cover bottoms and sidewalls of the plurality of bit line contact openings. The first coverage layer 407 may prevent the top surface of the contact 401 formed including tungsten from being exposed to oxygen or air; therefore, the first coverage layer 407 may reduce formation of the defects on the top surface of the contact 401 formed including tungsten. A conductive material, for example, aluminum, copper, tungsten, cobalt, or other suitable metal or metal alloy is deposited, by a metallization process such as chemical vapor deposition, physical vapor deposition, sputtering, or the like, in the plurality of bit line contact openings to form the plurality of bit line contacts 405. A planarization process, such as chemical mechanical polishing, may be performed after the metallization process to remove excess deposited material and provide a substantially flat surface for subsequent processing steps.

With reference to FIGS. 12 and 13, the plurality of bit line contacts 405 are correspondingly electrically connected to the first contacts 401; that is to say, the plurality of bit line contacts 405 are electrically coupled to the first doped region 301.

Figure 14:
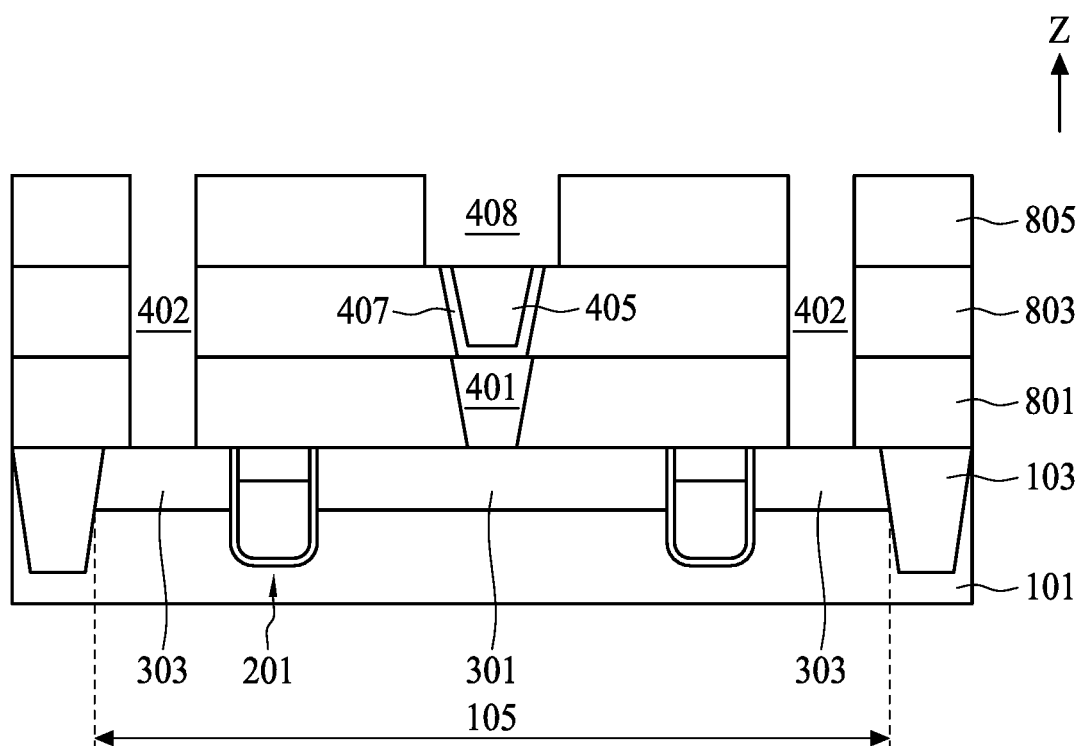
FIG. 14 illustrates, in a schematic cross-sectional diagram, part of the flow of fabricating the semiconductor device in accordance with one embodiment of the present disclosure.
Figure 15:
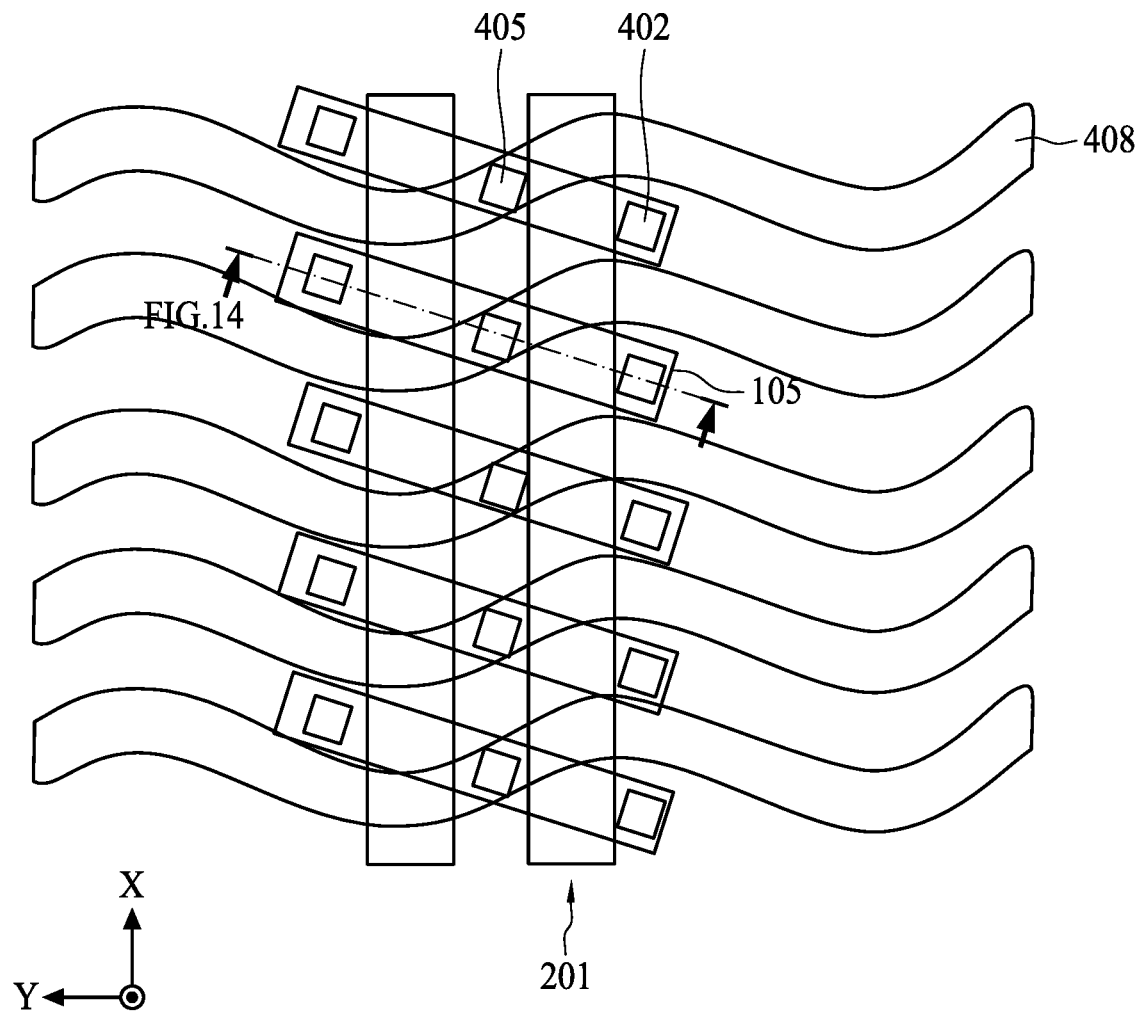
FIG. 15 illustrates, in a schematic top-view diagram, the semiconductor device in accordance with FIG. 14.

FIG. 14 illustrates, in a schematic cross-sectional diagram, part of the flow of fabricating the semiconductor device in accordance with one embodiment of the present disclosure. FIG. 15 illustrates, in a schematic top-view diagram, the semiconductor device in accordance with FIG. 14.

With reference to FIG. 1 and FIGS. 14 and 15, at step S15, a plurality of bit lines may be formed respectively over the plurality of bit line contact on the substrate. (Only one bit line 409 is shown in FIG. 14.) A third insulating film 805 may be formed on the second insulating film 803. The third insulating film 805 may be formed of a same material as the material of the first insulating film 801, but is not limited thereto. A photolithography process may be used to pattern the third insulating film 805 to define positions of the plurality of bit lines 409. An etch process, such as an anisotropic dry etch process, may be performed after the photolithography process to form a plurality of bit line trench openings 408 in the third insulating film 805. In some embodiments, the photolithography process may also pattern the third insulating film 805 to define positions of a plurality of contact holes 402, and an etch process may be performed to form a plurality of contact holes 402 penetrating through the third insulating film 805, the second insulating film 803, and the first insulating film 801. In other words, the contact holes 402 are considered deep holes, while the bit line trench openings 408 are considered relatively shallow holes.

Figure 16:
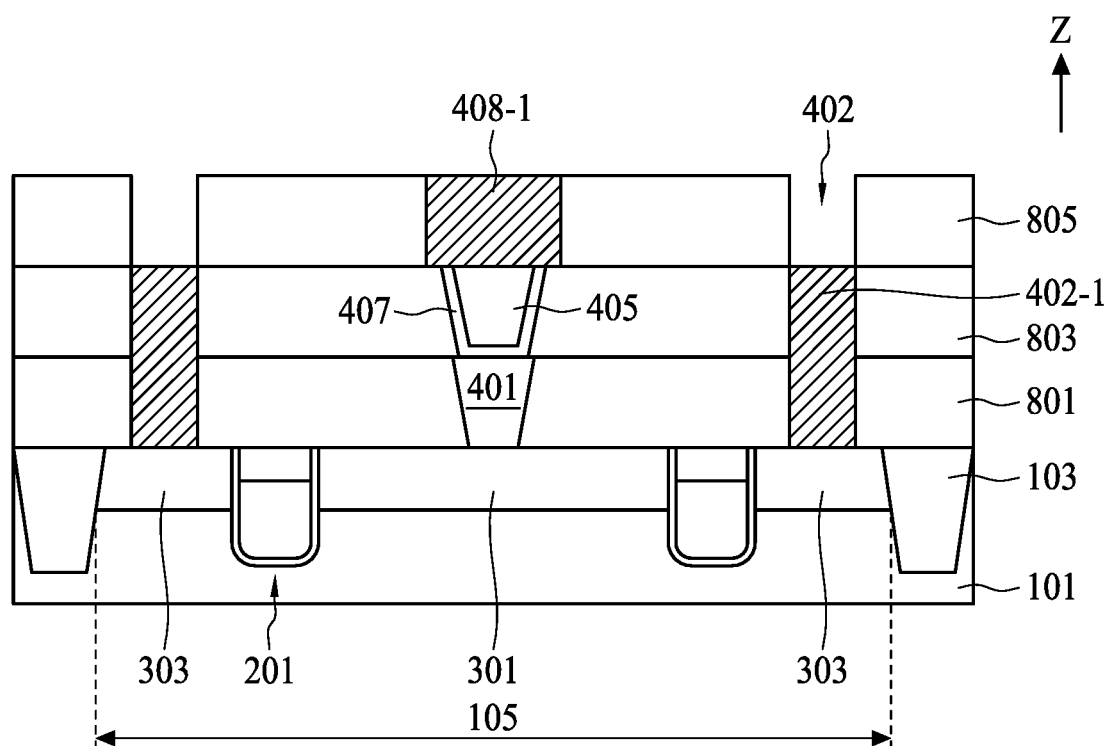
FIG. 16 illustrates, in a schematic cross-sectional diagram, part of the flow of fabricating the semiconductor device in accordance with one embodiment of the present disclosure.
Figure 17:
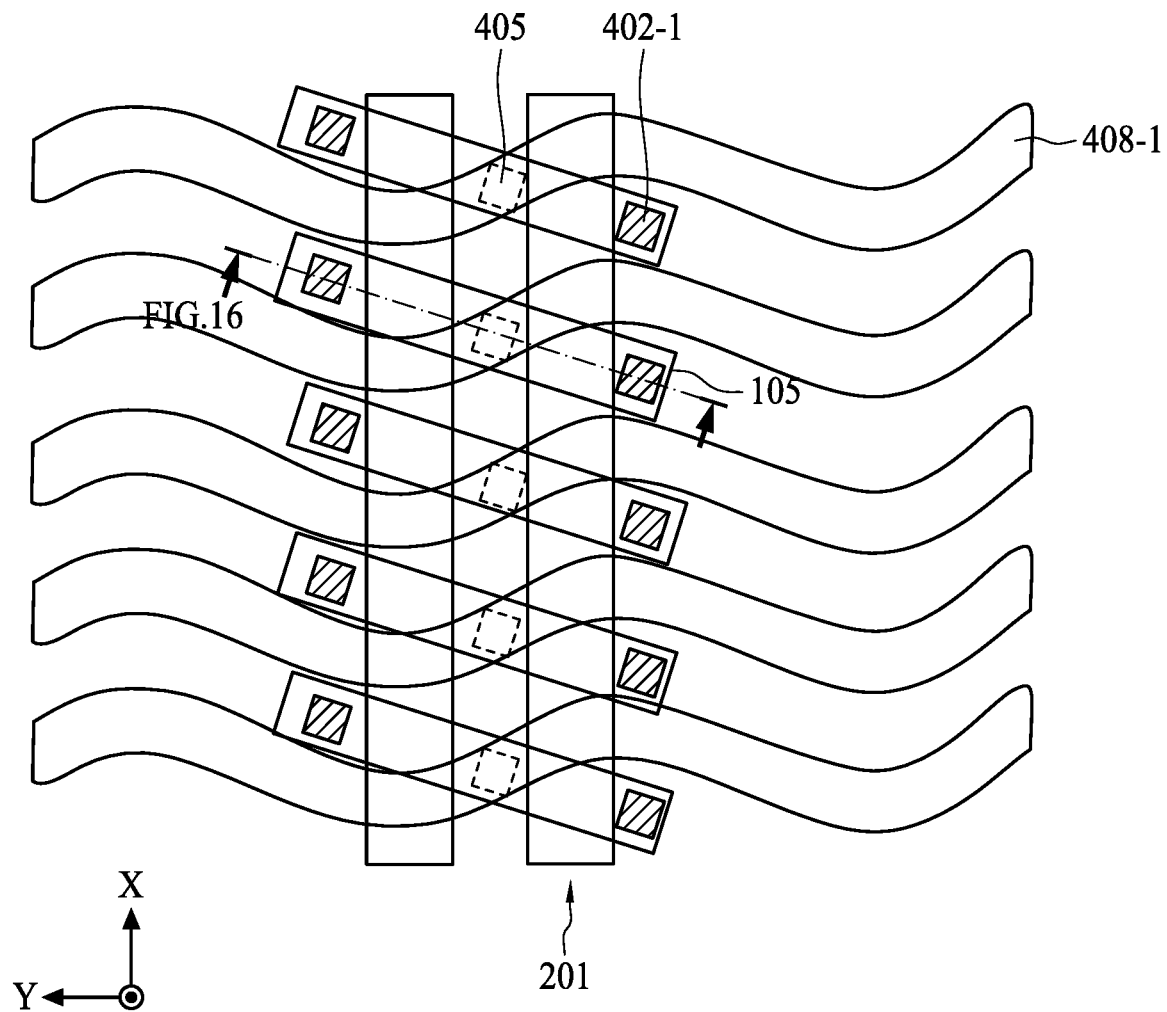
FIG. 17 illustrates, in a schematic top-view diagram, the semiconductor device in accordance with FIG. 16.

FIG. 16 illustrates, in a schematic cross-sectional diagram, part of the flow of fabricating the semiconductor device in accordance with one embodiment of the present disclosure. FIG. 17 illustrates, in a schematic top-view diagram, the semiconductor device in accordance with FIG. 16. In some embodiments, the bit line trench openings 408 and the contact holes 402 may be filled with material by processes such as chemical vapor deposition, physical vapor deposition, sputtering, or the like. In some embodiments, the contact holes 402 is deeper than the bit line trench openings 408, and the bit line trench openings 408 may be completely filled by a filling material 408-1, and the contact holes 402 may be partially filled by a filling material 402-1, which can be the same as the filling material 408-1. In some embodiments, the upper portion of the contact holes 402 in the third insulating film 805 is not filled by the filling material 402-1.

Figure 18:
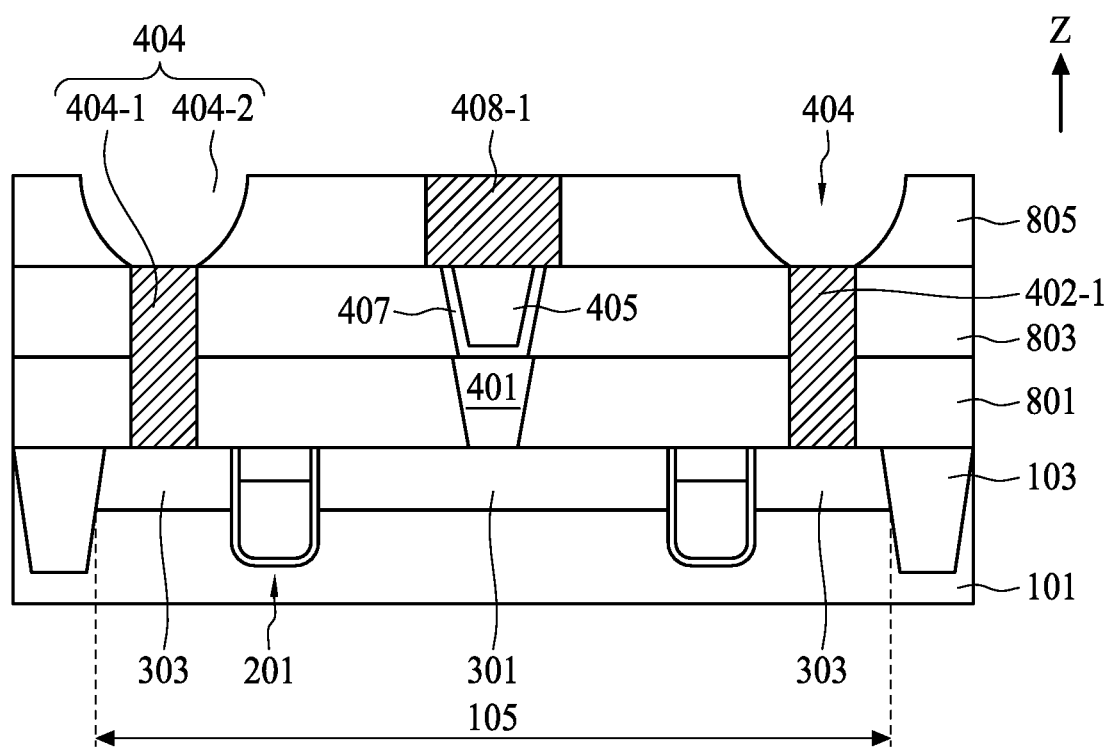
FIG. 18 illustrates, in a schematic cross-sectional diagram, part of the flow of fabricating the semiconductor device in accordance with one embodiment of the present disclosure.
Figure 19:
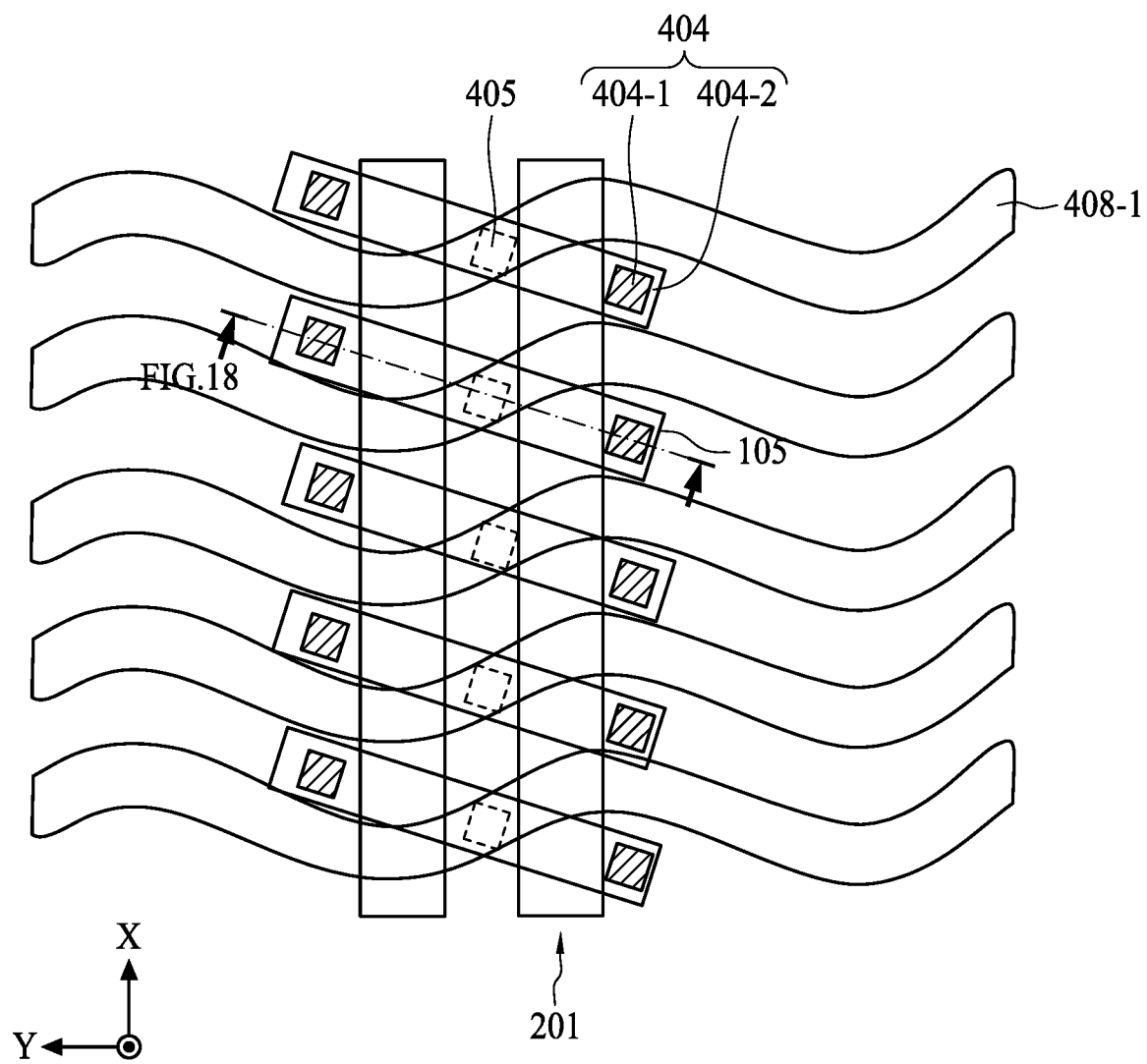
FIG. 19 illustrates, in a schematic top-view diagram, the semiconductor device in accordance with FIG. 18.
Figure 21:
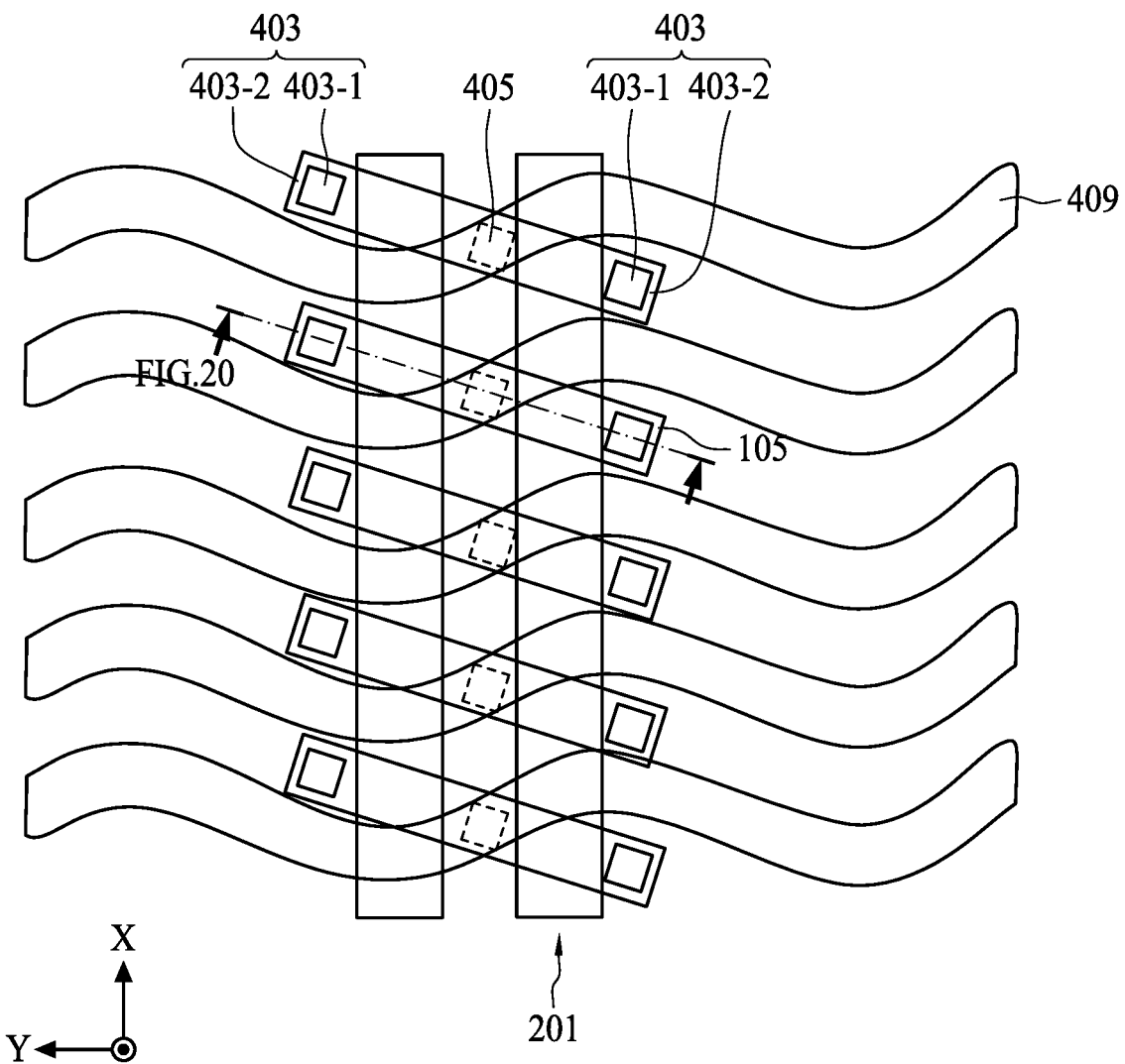
FIG. 21 illustrates, in a schematic top-view diagram, the semiconductor device in accordance with FIG. 20.

With reference to FIG. 1 and FIGS. 18 and 21, at step S17, a plurality of capacitor contacts respectively over the second regions of the substrate. FIG. 18 illustrates, in a schematic cross-sectional diagram, part of the flow of fabricating the semiconductor device in accordance with one embodiment of the present disclosure. FIG. 19 illustrates, in a schematic top-view diagram, the semiconductor device in accordance with FIG. 18. In some embodiments, an etch process, such as an isotropic etch process, may be performed to remove a portion of the third insulating film 805 around the contact holes 402 to form a plurality of transformed holes 404 having a narrow portion 404-1 occupied by the filling material 402-1 in the second insulating film 803 and a wide portion 404-2 in the third insulating film 805.

Figure 20:
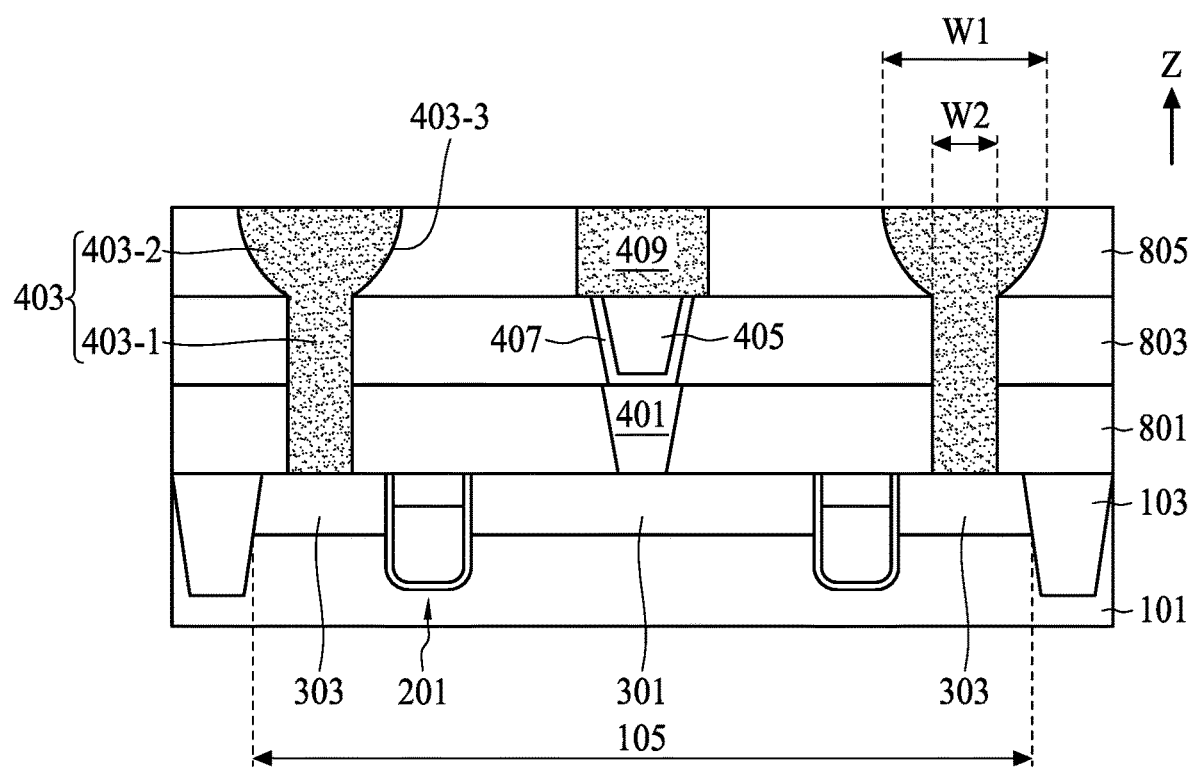
FIG. 20 illustrates, in a schematic cross-sectional diagram, part of the flow of fabricating the semiconductor device in accordance with one embodiment of the present disclosure.

FIG. 20 illustrates, in a schematic cross-sectional diagram, part of the flow of fabricating the semiconductor device in accordance with one embodiment of the present disclosure. FIG. 21 illustrates, in a schematic top-view diagram, the semiconductor device in accordance with FIG. 20. In some embodiments, the filling material 402-1 and the filling material 408-1 are stripped from the transformed holes 404 and the bit line trench openings 408, respectively. After stripping the filling material, a conductive material, for example, aluminum, copper, tungsten, cobalt, or other suitable metal or metal alloy is deposited, by a metallization process such as chemical vapor deposition, physical vapor deposition, sputtering, or the like, in the plurality of bit line trench openings 408 to form a plurality of bit lines 409 and in the transformed holes 404 to form a plurality of capacitor contacts 403. A planarization process, such as chemical mechanical polishing, may be performed after the metallization process to remove excess deposited material and provide a substantially flat surface for subsequent processing steps.

In some embodiments, the capacitor contact 403 includes a neck portion 403-1 and a head portion 403-2 over the neck portion 403-1, wherein an upper width W1 of the head portion 403-2 is larger than an upper width W2 of the neck portion 403-1. In some embodiments, the upper width W2 of the neck portion 403-1 is substantially the same as a bottom width of the head portion 403-2. In some embodiments, the head portion 403-2 has a curved sidewall 403-3. In some embodiments, the head portion has tapered profile.

With reference to FIGS. 20 and 21, the plurality of bit lines 409 may extend along a direction Y and implemented as wavy lines in a top-view diagram. The plurality of bit line contacts 405 are located at intersections of the plurality of bit lines 409 and the plurality of active regions 105. The plurality of bit lines 409 implemented as wavy lines may increase a contact area between the plurality of bit line contacts 405 and the plurality of active regions 105; therefore, a contact resistance between the plurality of bit line contacts 405 and the plurality of active regions 105 may be reduced.

Figure 22:
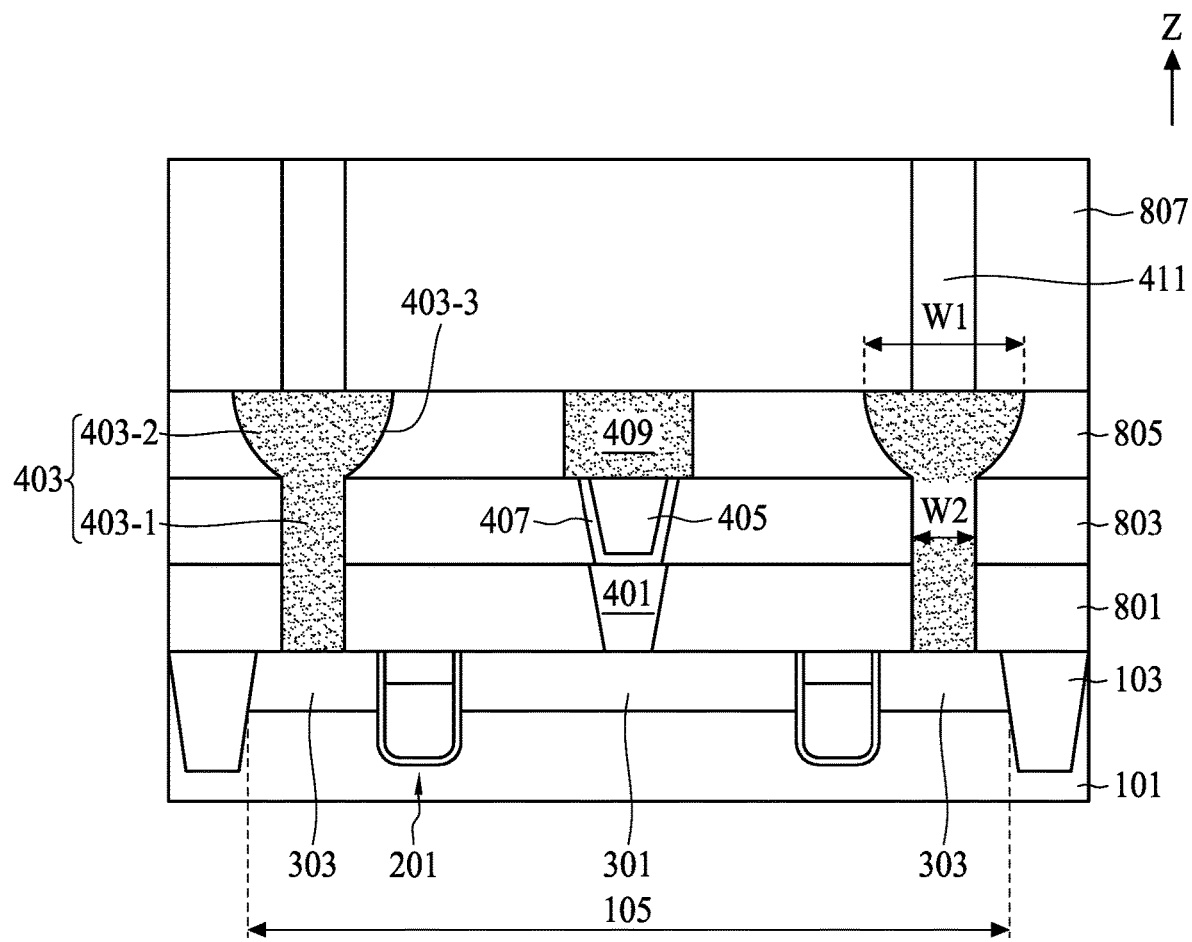
FIGS. 22 to 26 illustrate, in schematic cross-sectional diagrams, part of the flow of fabricating the semiconductor device in accordance with one embodiment of the present disclosure.

With reference to FIG. 1 and FIG. 22, at step S19, a plurality of capacitor plugs are respectively formed over the plurality of capacitor contacts. FIG. 22 illustrates, in a schematic cross-sectional diagram, part of the flow of fabricating the semiconductor device in accordance with one embodiment of the present disclosure. With reference to FIG. 1 and FIG. 22, a plurality of capacitor plugs 411 may be formed above the substrate 101. A fourth insulating film 807 may be formed on the third insulating film 805. The fourth insulating film 807 may be formed of a same material as the material of the first insulating film 801, but is not limited thereto. A photolithography process may be used to pattern the fourth insulating film 807 to define positions of the plurality of capacitor plugs 411. An etch process, such as an anisotropic dry etch process, may be performed after the photolithography process to form a plurality of plug openings passing through the fourth insulating film 807, the third insulating film 805, and the second insulating film 803. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the plurality of plug openings to form the plurality of capacitor plugs 411 over the head portion 403-2. A planarization process, such as chemical mechanical polishing, may be performed after the metallization process to remove excess deposited material and provide a substantially flat surface for subsequent processing steps.

Figure 23:
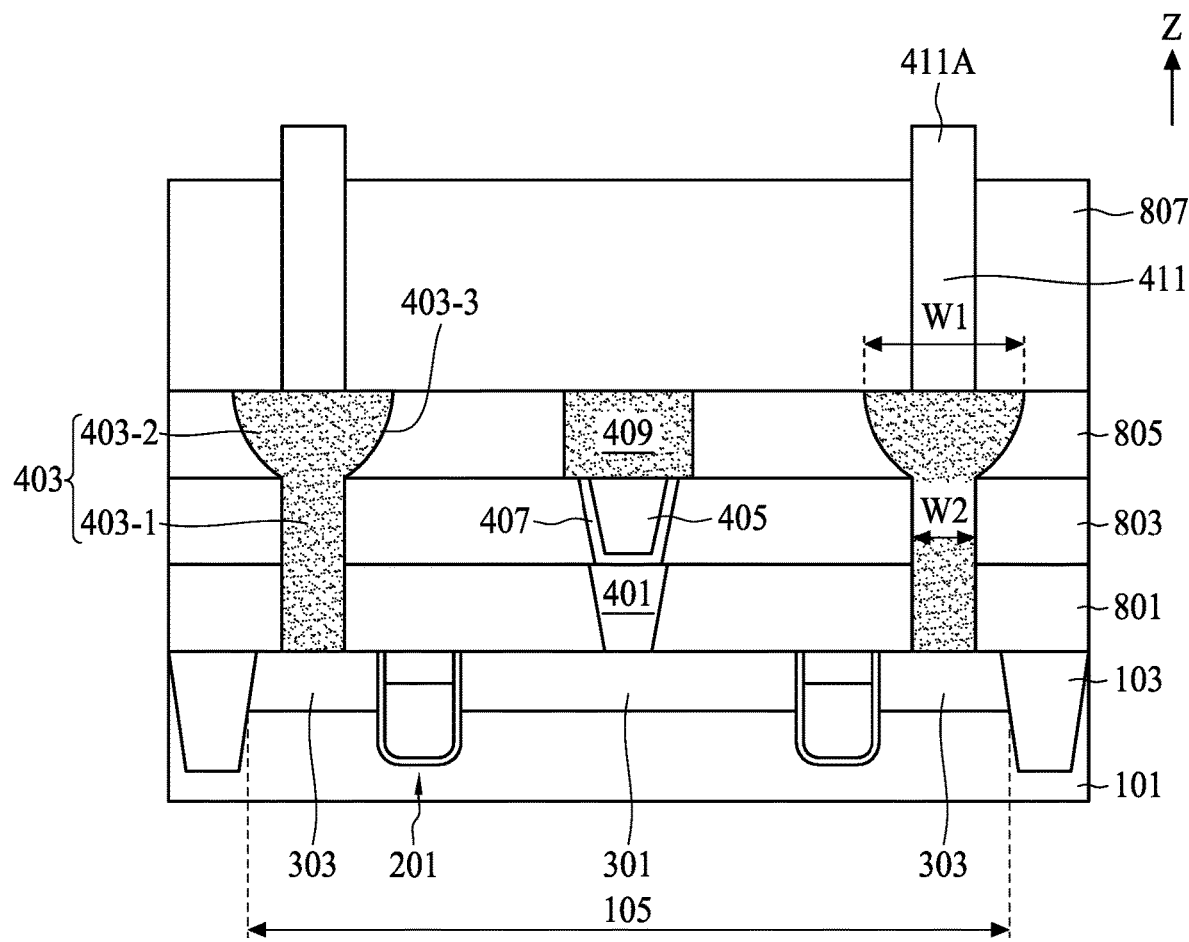

With reference to FIG. 1 and FIGS. 23 to 26, at step S21, a plurality of first spacers are respectively formed over a plurality of protruding portions of the plurality of capacitor plugs. FIG. 23 illustrates, in a schematic cross-sectional diagram, part of the flow of fabricating the semiconductor device in accordance with one embodiment of the present disclosure. With reference to FIG. 1 and FIG. 23, an etching back process is performed to remove a top portion of the fourth insulating film 807 to expose a protruding portion 411A of the capacitor plug 411. In some embodiments, after the etching back process, the top surface of the capacitor plug 411 is higher than that of the fourth insulating film 807, and the sidewall of the capacitor plug 411 (protruding portion 411A) is exposed.

Figure 24:
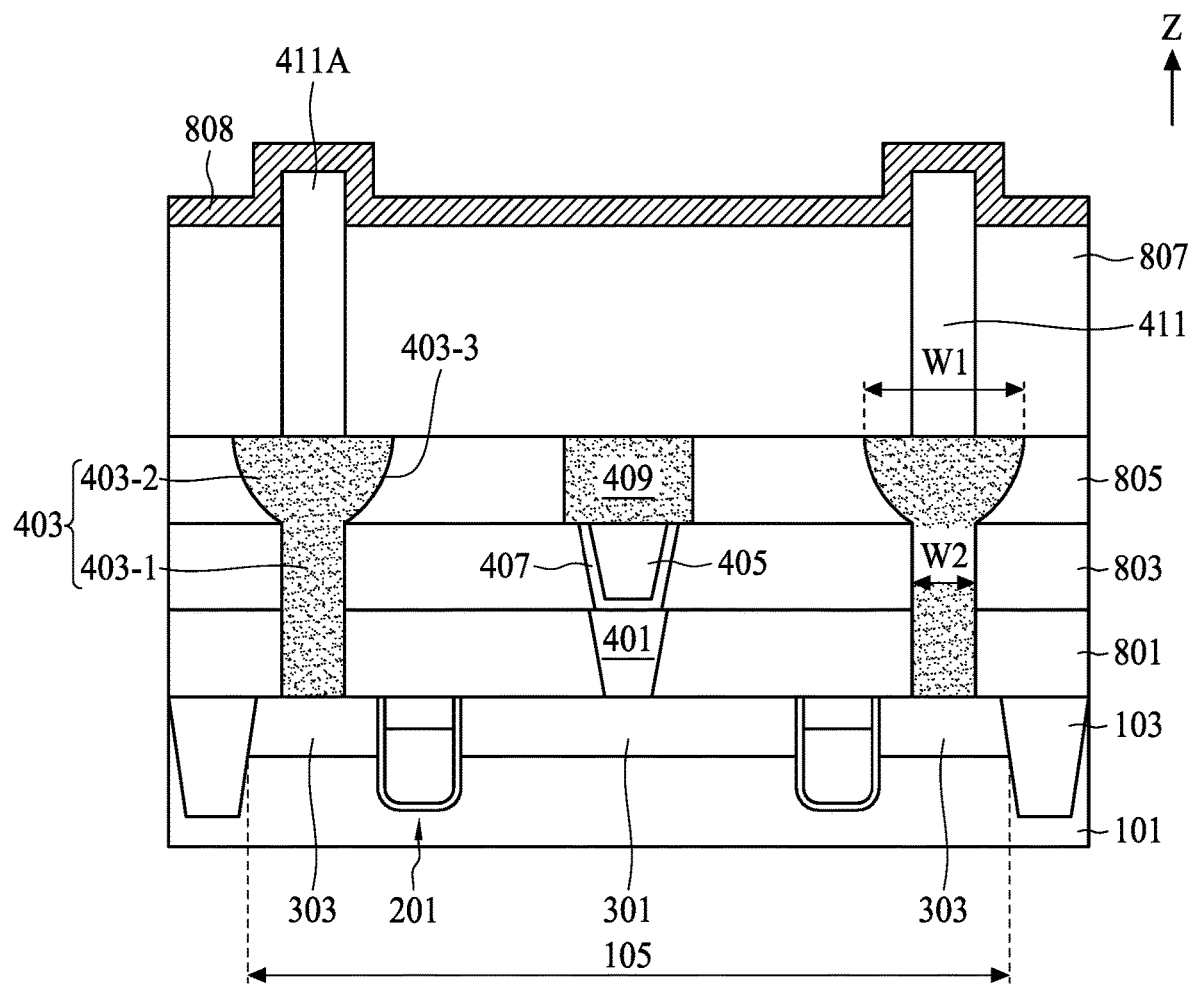

FIG. 24 illustrates, in a schematic cross-sectional diagram, part of the flow of fabricating the semiconductor device in accordance with one embodiment of the present disclosure. In some embodiments, a deposition process is performed to form a liner layer 808, covering the top surface of the fourth insulating film 807, the top surface of the protruding portion 411A, and the sidewall of the protruding portion 411A.

Figure 25:
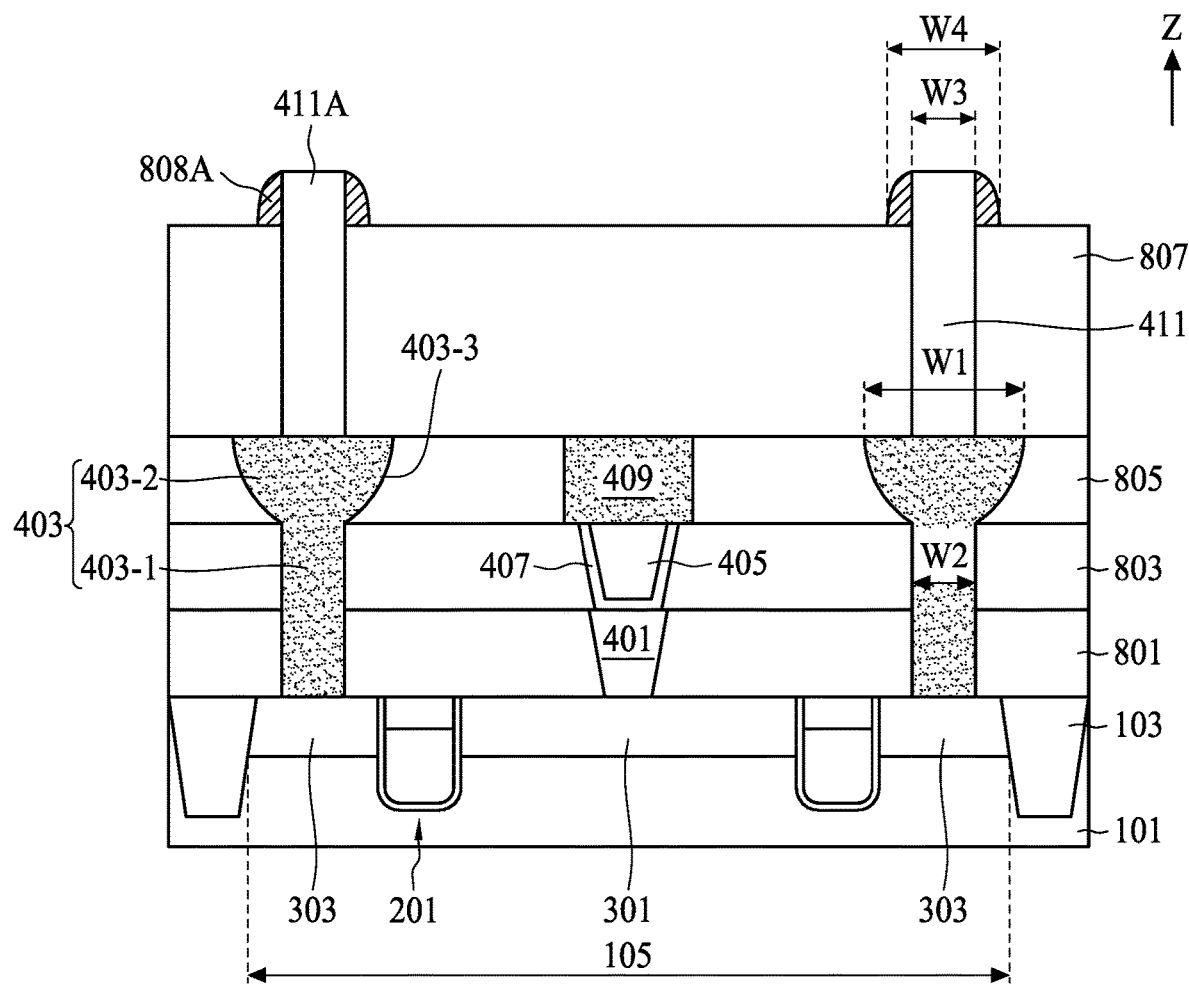

FIG. 25 illustrates, in a schematic cross-sectional diagram, part of the flow of fabricating the semiconductor device in accordance with one embodiment of the present disclosure. In some embodiments, an anisotropic dry etching process is performed to remove a portion of the liner layer 808 so as to form a plurality of first spacers 808A respectively on the protruding portion 411A. In some embodiments, the first spacer 808A comprises metal silicide and is disposed on a sidewall of the protruding portion 411A. In some embodiments, the width W4 of the first spacer 808A is larger than the width W3 of the capacitor plug 411.

Figure 26:
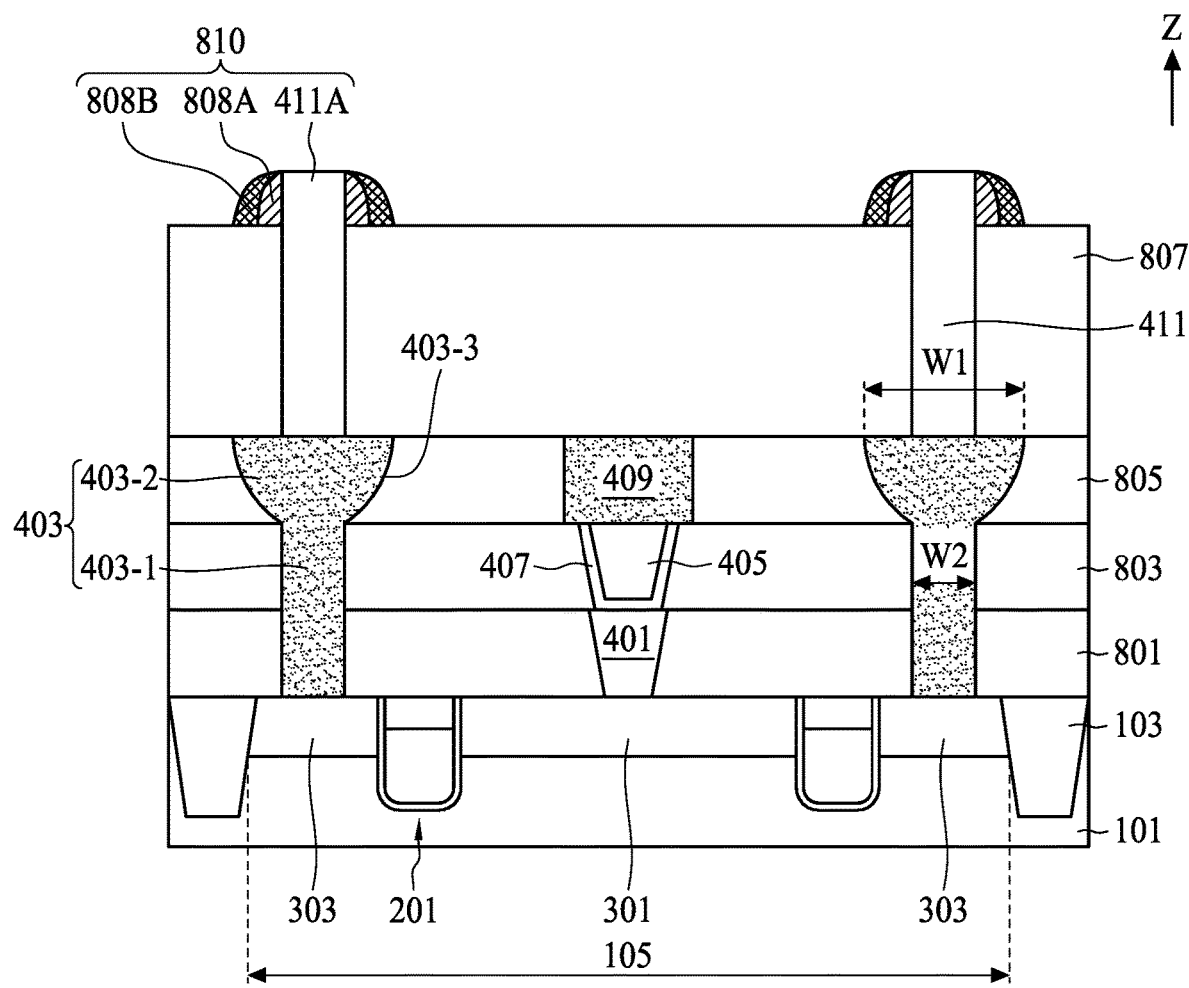

FIG. 26 illustrates, in a schematic cross-sectional diagram, part of the flow of fabricating the semiconductor device in accordance with one embodiment of the present disclosure. In some embodiments, a salicidation process is performed to form a plurality of second spacers 808B respectively over the first spacers 808A. In some embodiments, the first spacer 808A comprises polysilicon and is disposed on a sidewall of the protruding portion 411A, and the second spacer 808B comprises metal silicide from the polysilicon of the first spacer 808A. In some embodiments, the protruding portion 411A, the first spacer 808A, and the second spacer 808B form a landing pad 810 over the capacitor contact 403.

Figure 27:
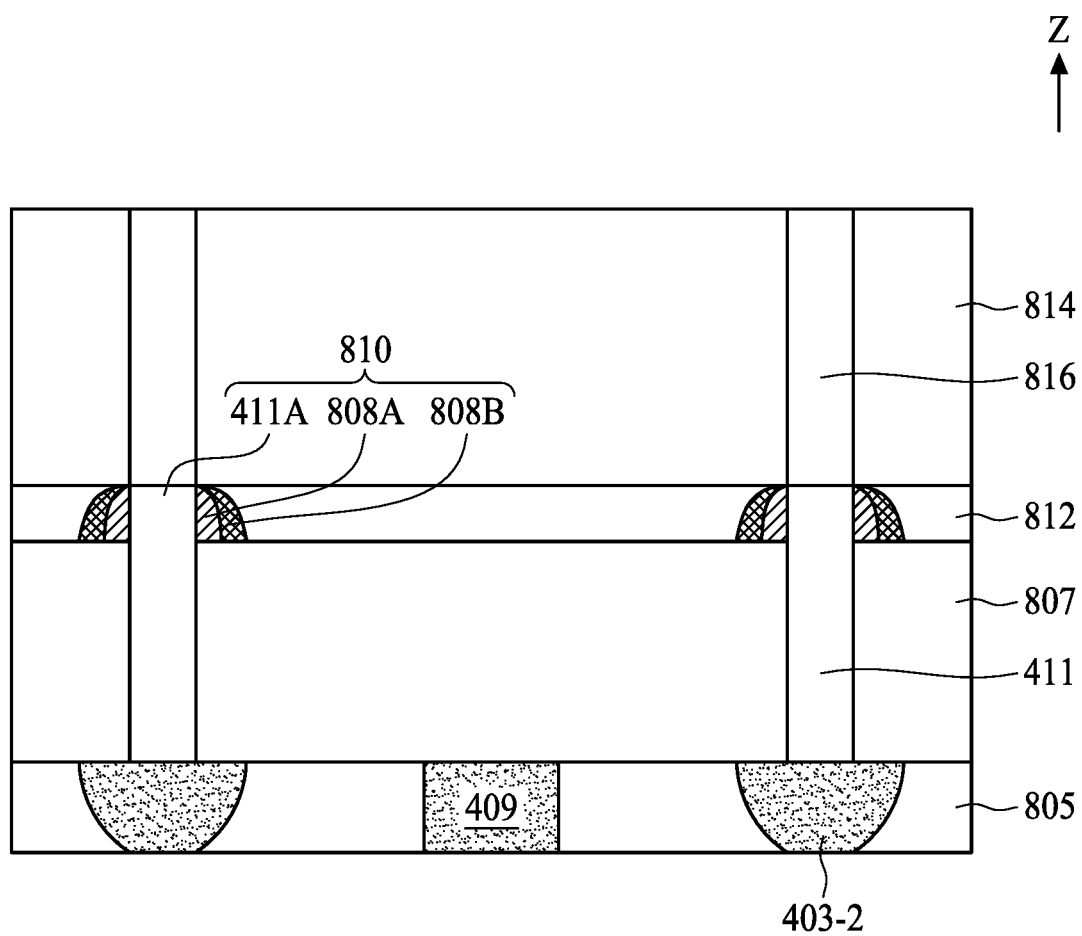
FIGS. 27 to 30 illustrate, in schematic cross-sectional diagrams, part of the flow of fabricating the semiconductor device in accordance with one embodiment of the present disclosure.

FIG. 27 illustrates, in a schematic cross-sectional diagram, part of the flow of fabricating the semiconductor device in accordance with one embodiment of the present disclosure. In some embodiments, a fifth insulating film 814 having a plug 816 may be formed over the landing pad 810. The fifth insulating film 814 may be formed of a same material as the material of the first insulating film 801, but is not limited thereto. A photolithography process may be used to pattern the fifth insulating film 814 to define positions of the plurality of plugs 816. An etch process, such as an anisotropic dry etch process, may be performed after the photolithography process to form a plurality of plug openings passing through the fifth insulating film 814. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the plurality of plug openings to form the plurality of plugs 816 over the landing pad 810. A planarization process, such as chemical mechanical polishing, may be performed after the metallization process to remove excess deposited material and provide a substantially flat surface for subsequent processing steps.

Figure 28:
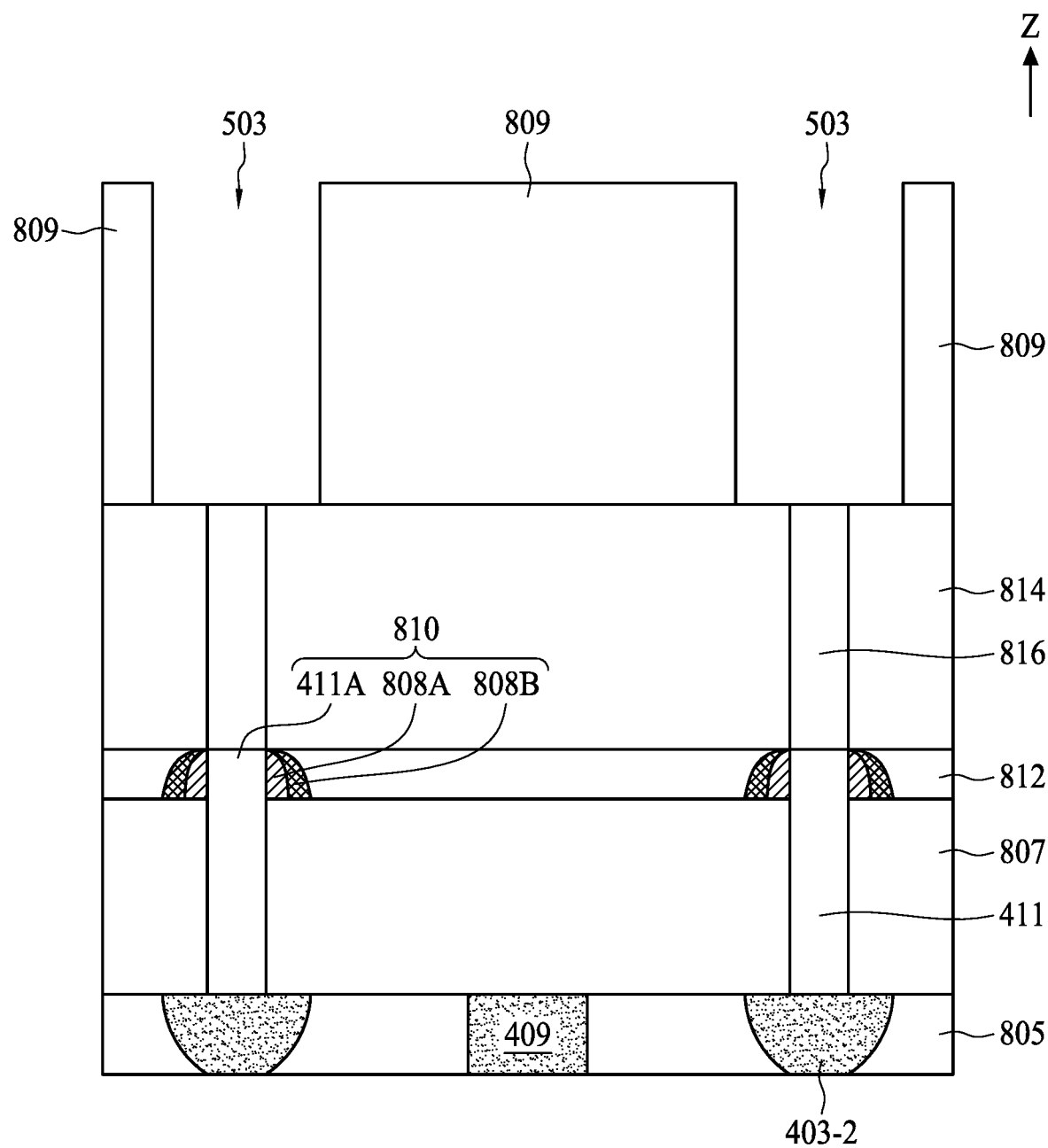
Figure 29:
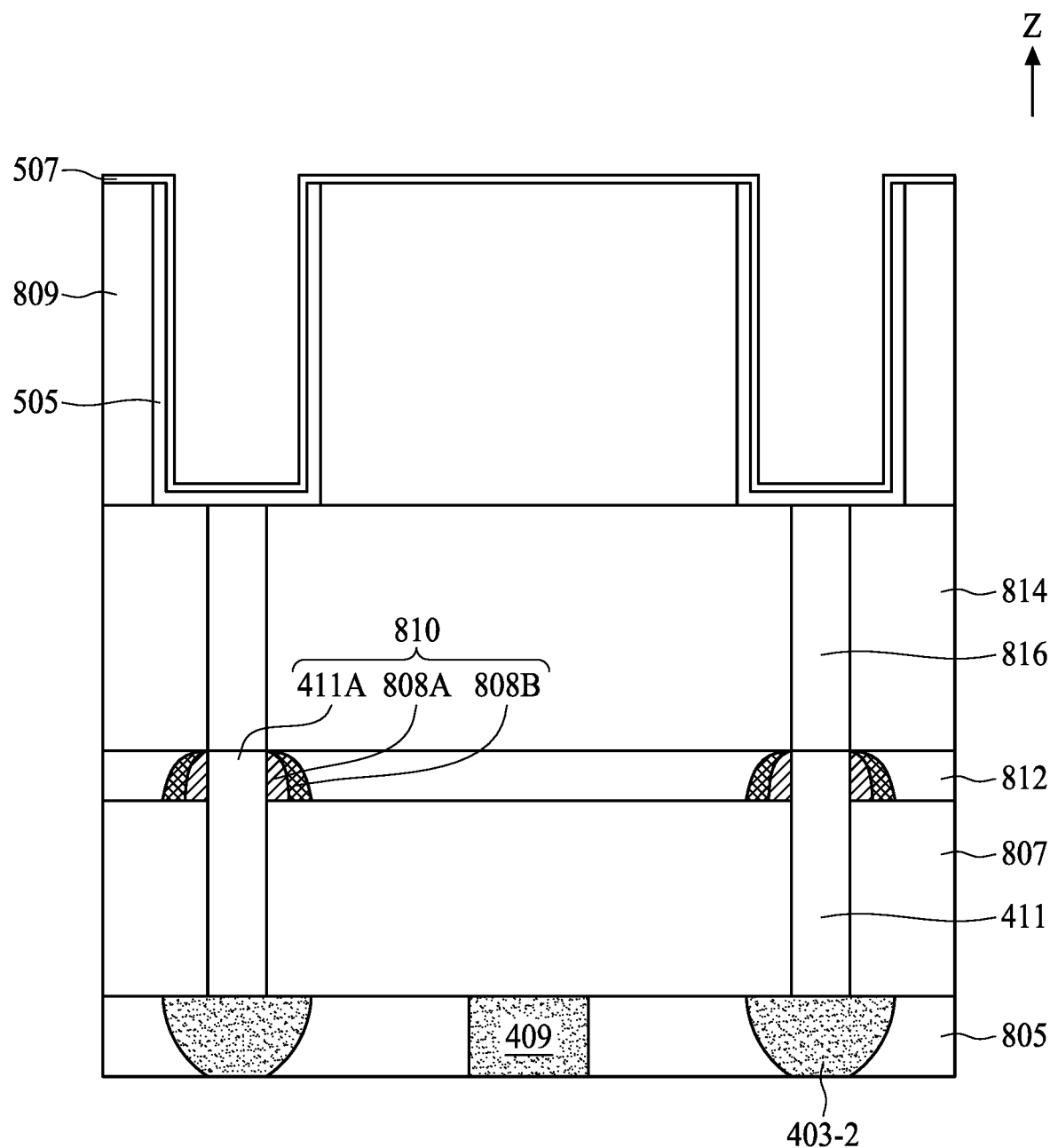
Figure 30:
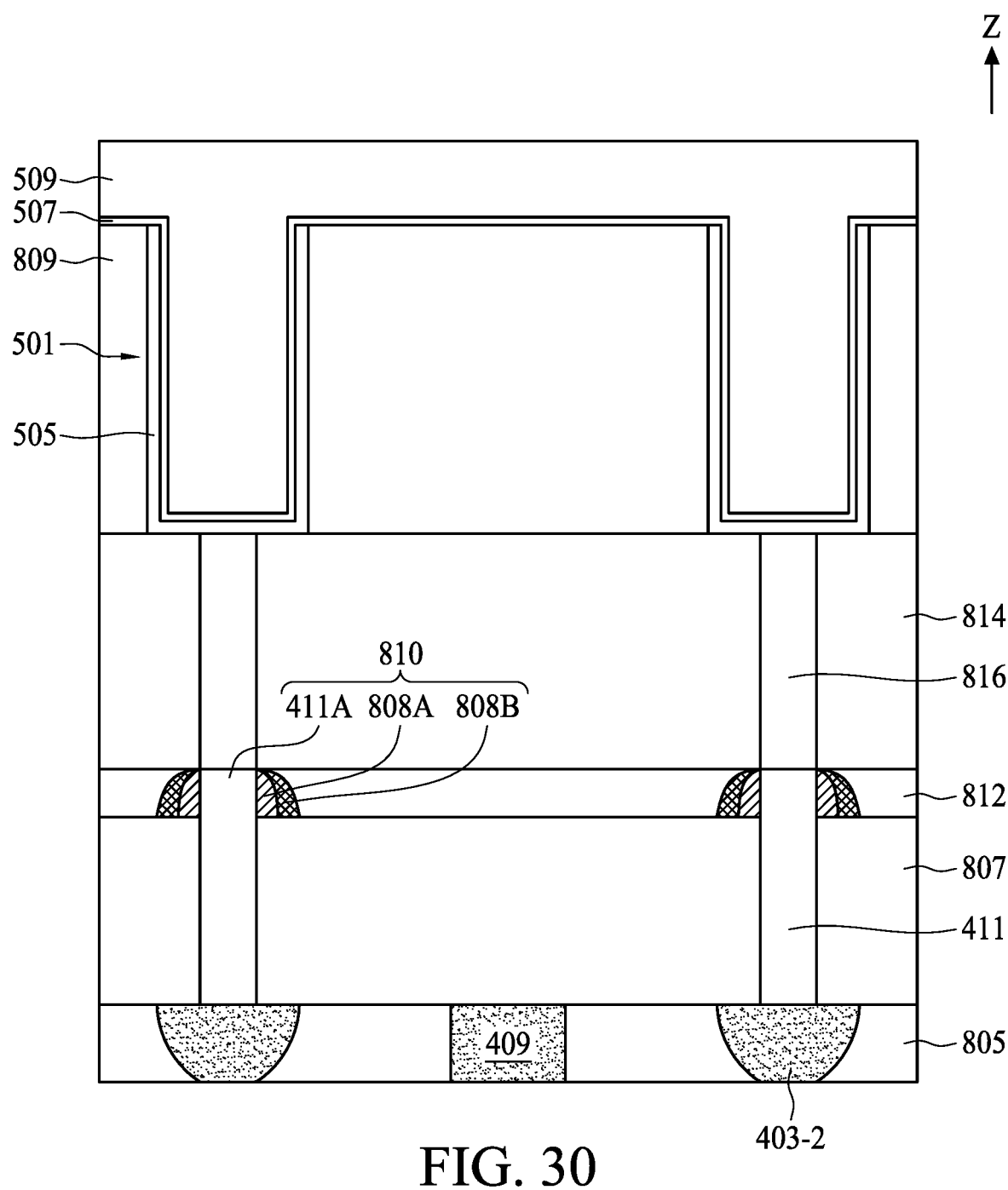
Figure 31:
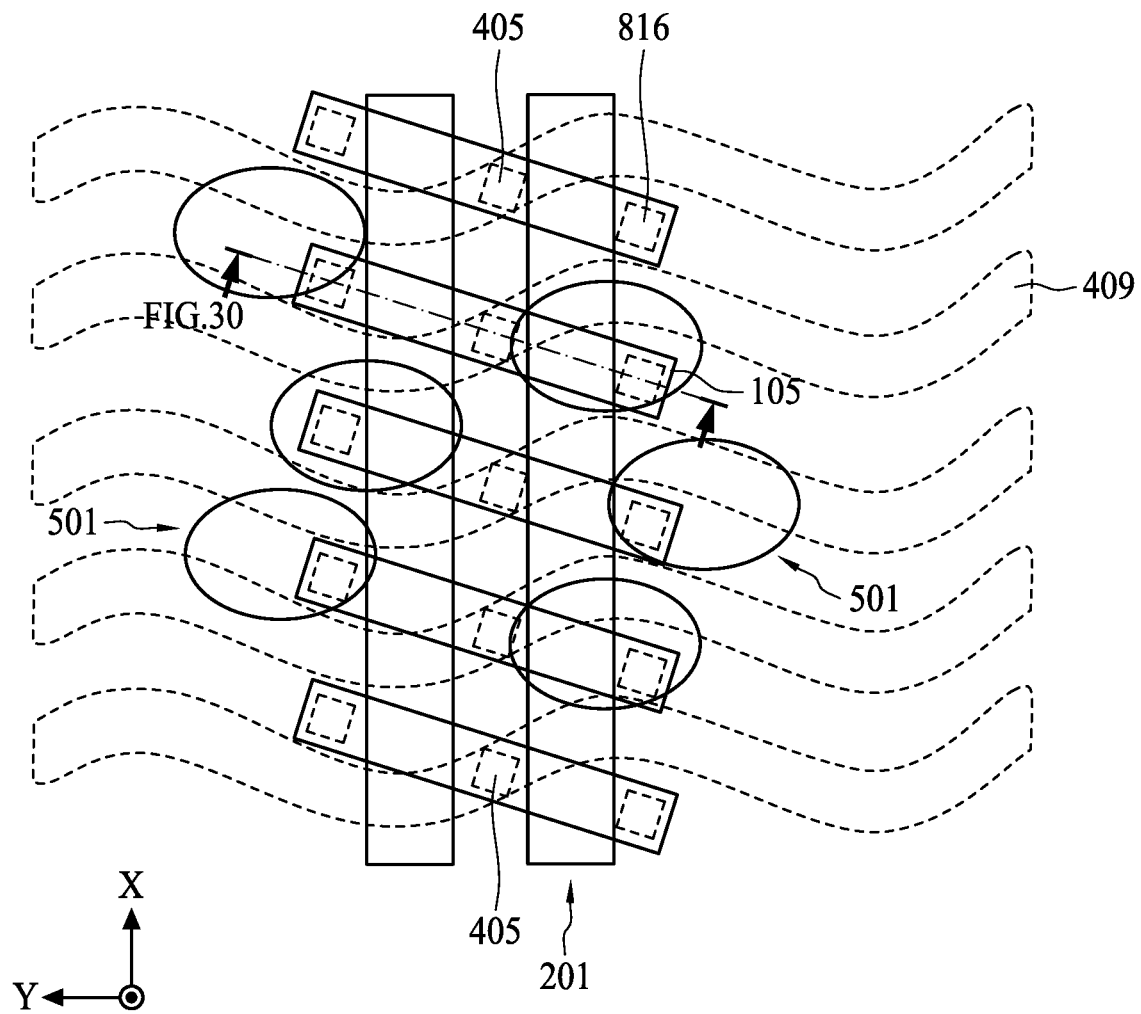
FIG. 31 illustrates, in a schematic top-view diagram, the semiconductor device in accordance with FIG. 30.

With reference to FIG. 1 and FIGS. 28 to 30, at step S23, a plurality of capacitor structures are formed respectively over the plurality of first spacers of the landing pads. FIGS. 28 to 30 illustrate, in schematic cross-sectional diagrams, part of the flow of fabricating the semiconductor device in accordance with one embodiment of the present disclosure. FIG. 31 illustrates, in a schematic top-view diagram, the semiconductor device in accordance with FIG. 30.

In some embodiments, the plurality of capacitor structures 501 may include a bottom electrode 505, a capacitor insulating layer 507, and a top electrode 509. With reference to FIG. 28, a fifth insulating film 809 may be formed on the fourth insulating film 807. The fifth insulating film 809 may be formed of a same material as the material of the first insulating film 801, but is not limited thereto. A photolithography process may be used to pattern the fifth insulating film 809 to define positions of a plurality of capacitor trenches 503. An etch process, such as an anisotropic dry etch process, may be performed after the photolithography process to form the plurality of capacitor trenches 503 passing through the fifth insulating film 809. The plurality of plugs 816 may be exposed through the plurality of capacitor trenches 503.

With reference to FIG. 29, a plurality of bottom electrodes 505 may be correspondingly respectively formed in the plurality of capacitor trenches 503, in other words, the plurality of bottom electrodes 505 may be inwardly formed in the fifth insulating film 809. The plurality of bottom electrodes 505 may be formed of, for example, doped polysilicon, metal silicide, aluminum, copper, or tungsten. The plurality of bottom electrodes 505 may be respectively correspondingly connected to the plurality of plugs 816.

With reference to FIG. 29, the capacitor insulating layer 507 may be formed to attach to sidewalls and bottoms of the plurality of bottom electrodes 505 and the top surfaces of the fifth insulating film 809. The capacitor insulating layer 507 may be a single layer or multiple layers. In the embodiment depicted, the capacitor insulating layer 507 may be a single layer or multiple layers. Specifically, the capacitor insulating layer 507 may be a single layer formed of a high dielectric constant material such as barium strontium titanate, lead zirconium titanate, titanium oxide, aluminum oxide, hafnium oxide, yttrium oxide, zirconium oxide, or the like. Alternatively, in another embodiment, the capacitor insulating layer 507 may be multiple layers consisting of silicon oxide, silicon nitride, and silicon oxide.

With reference to FIGS. 30 and 31, the top electrode 509 may be formed to fill the plurality of capacitor trenches 503 and cover the capacitor insulating layer 507. The top electrode 509 may be formed of, for example, doped polysilicon, copper, or aluminum.

Figure 32:
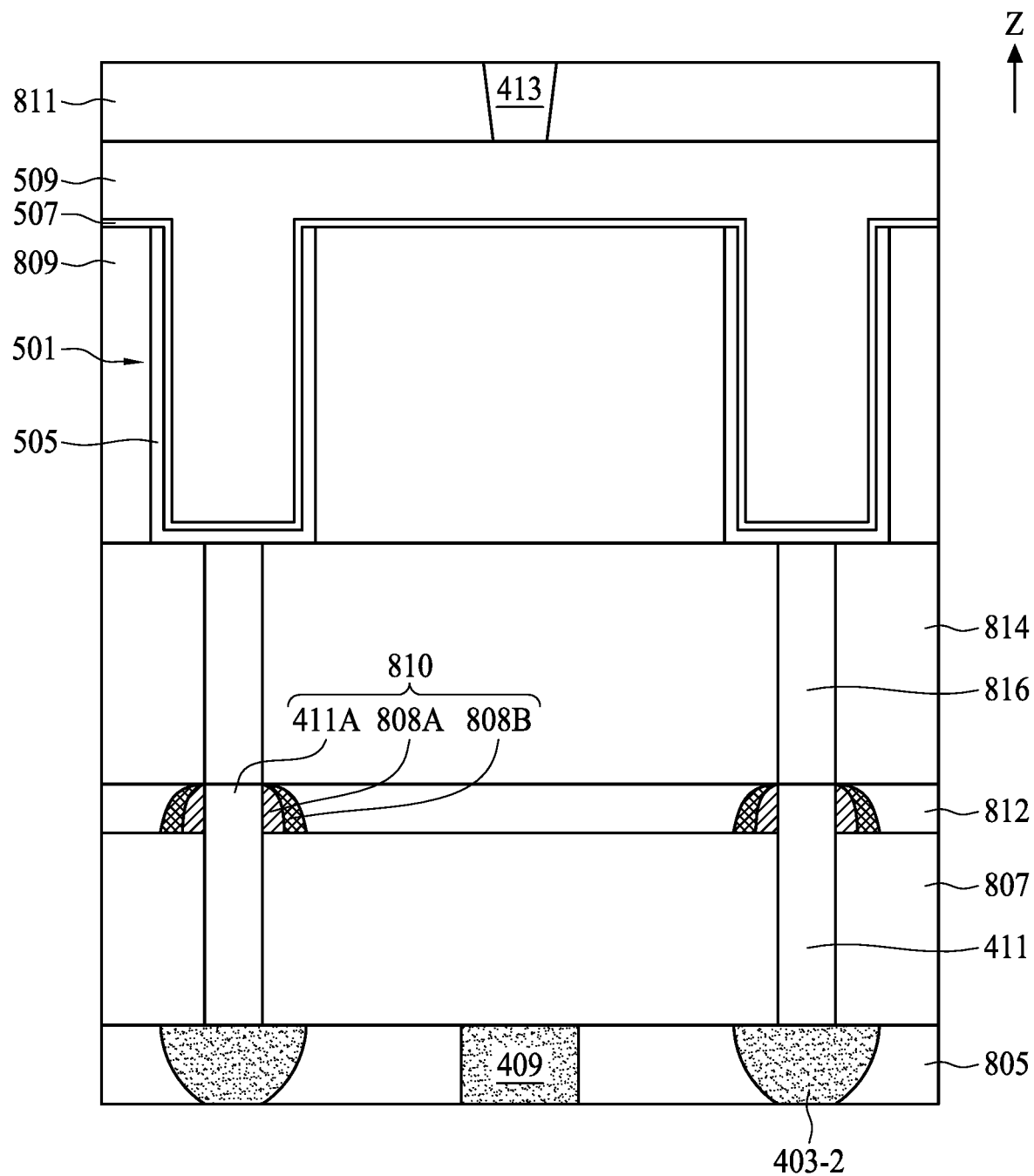
FIGS. 32 to 35 illustrate, in schematic cross-sectional diagrams, part of the flow of fabricating the semiconductor device in accordance with one embodiment of the present disclosure.

FIGS. 32 to 35 illustrate, in schematic cross-sectional diagrams, part of the flow of fabricating the semiconductor device in accordance with one embodiment of the present disclosure. In some embodiments, a bottom via 413 and a first conductive layer 415 may be formed above the substrate 101. With reference to FIG. 32, a sixth insulating film 811 may be formed on the fifth insulating film 809. The sixth insulating film 811 may be formed of a same material as the material of the first insulating film 801, but is not limited thereto. A photolithography process may be used to pattern the sixth insulating film 811 to define positions of the bottom via 413. An etch process, such as an anisotropic dry etch process, may be performed after the photolithography process to form a bottom via opening passing through the sixth insulating film 811. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the bottom via opening to form the bottom via 413 in the sixth insulating film 811. A planarization process, such as chemical mechanical polishing, may be performed after the metallization process to remove excess deposited material and provide a substantially flat surface for subsequent processing steps.

With reference to FIG. 32, in the embodiment depicted, the bottom via 413 is formed including tungsten. Defects may be easily formed on a top surface of the bottom via 413 formed including tungsten when the top surface of the bottom via 413 is exposed to oxygen or air. The defects may affect the yield of the semiconductor device.

Figure 33:
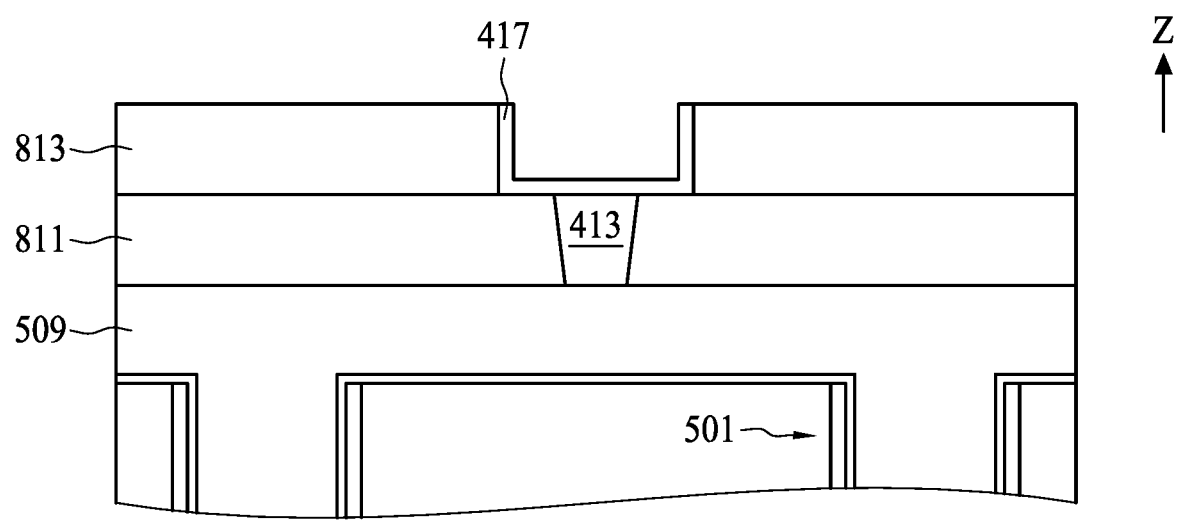

With reference to FIG. 33, a seventh insulating film 813 may be formed on the sixth insulating film 811. The seventh insulating film 813 may be formed of a same material as the material of the first insulating film 801, but is not limited thereto. A photolithography process may be used to pattern the seventh insulating film 813 to define a position of the first conductive layer 415. An etch process, such as an anisotropic dry etch process, may be performed after the photolithography process to form a first conductive layer trench in the seventh insulating film 813. The top surface of the bottom via 413 may be exposed through the first conductive layer trench. A cleaning process using a reducing agent may be optionally performed to remove the defects on the top surface of the bottom via 413 formed including tungsten. The reducing agent may be titanium tetrachloride, tantalum tetrachloride, or combination thereof.

Figure 34:
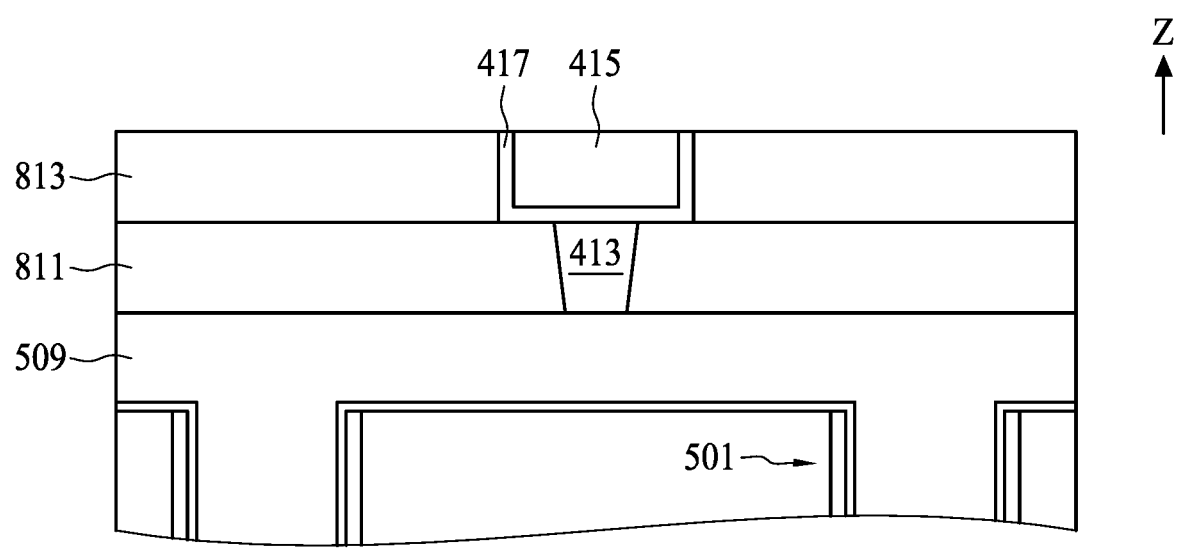

With reference to FIGS. 33 and 34, after the cleaning process, a second coverage layer 417 formed including tungsten nitride may be formed to cover a bottom and sidewalls of the first conductive layer trench. The second coverage layer 417 may prevent the top surface of the bottom via 413 formed including tungsten from being exposed to oxygen or air; therefore, the second coverage layer 417 may reduce formation of the defects on the top surface of the bottom via 413 formed including tungsten. A conductive material, for example, aluminum, copper, tungsten, cobalt, or other suitable metal or metal alloy is deposited, by a metallization process such as chemical vapor deposition, physical vapor deposition, sputtering, or the like, in the first conductive layer trench to form the first conductive layer 415. A planarization process, such as chemical mechanical polishing, may be performed after the metallization process to remove excess deposited material and provide a substantially flat surface for subsequent processing steps.

Figure 35:
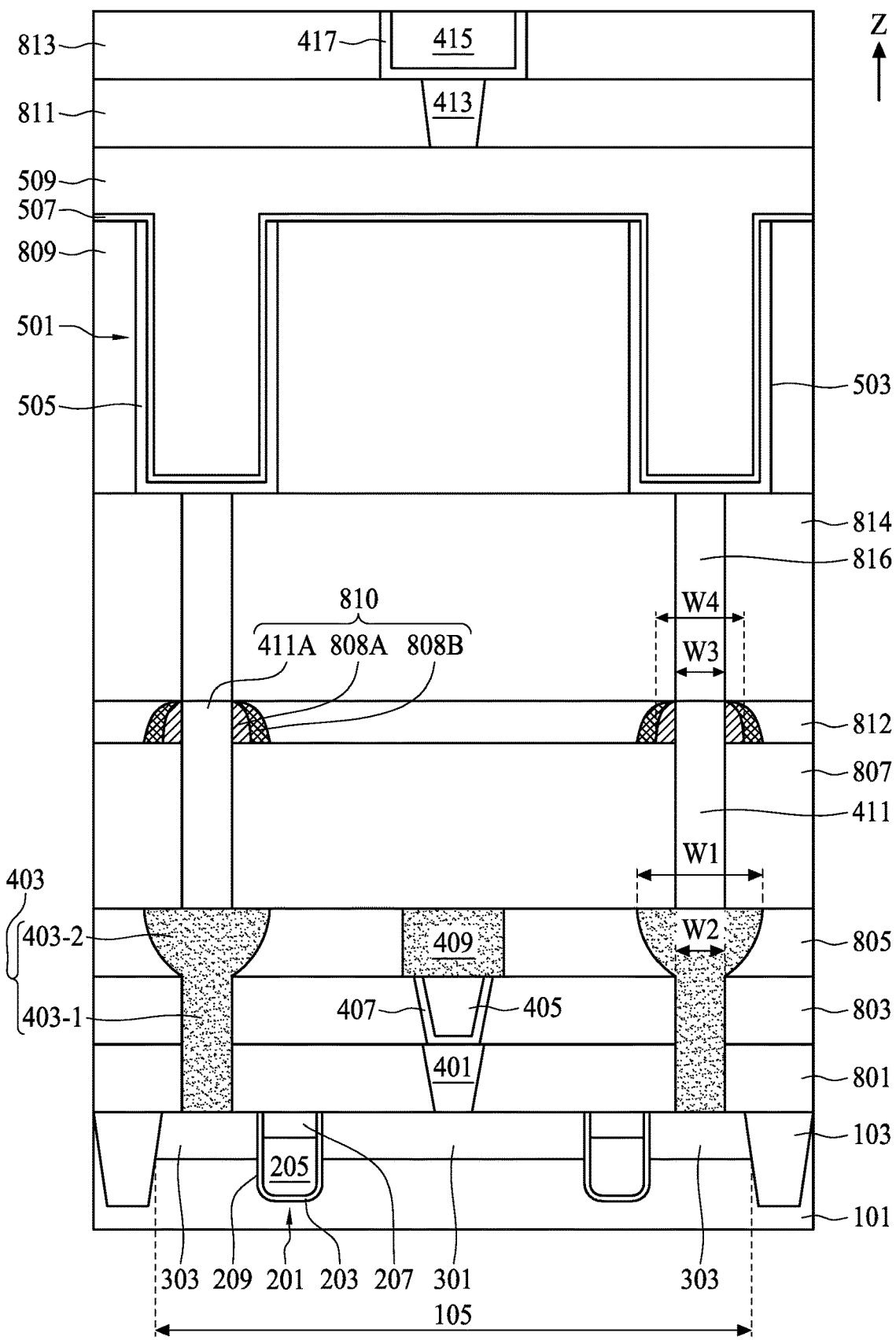

FIG. 35 illustrates, in a schematic cross-sectional view diagram, a semiconductor device in accordance with one embodiment of the present disclosure.

With reference to FIG. 35, a semiconductor device may include a substrate 101, a plurality of isolation structures 103, a plurality of word lines 201, a plurality of doped regions, a plurality of insulating films, a plurality of contacts, a plurality of bit line contacts 405, a first coverage layer 407, a plurality of bit lines 409, a plurality of plugs 411, a plurality of landing pads 810, a plurality of plugs 816, a bottom via 413, a first conductive layer 415, a second coverage layer 417, and a plurality of capacitor structures 501.

With reference to FIG. 35, the plurality of isolation structures 103 may be disposed in the substrate 101 and separated from each other. The plurality of isolation structures 103 may define a plurality of active regions 105. The plurality of word lines 201 may be disposed in the substrate 101 and separated from each other. Each one of the plurality of word lines 201 includes a bottom layer 203, a middle layer 205, and a top layer 207. The plurality of bottom layers 203 may be respectively inwardly disposed in the substrate 101. The plurality of middle layers 205 may be respectively correspondingly disposed on the plurality of bottom layers 203. Top surfaces of the plurality of middle layers 205 may be lower than a top surface of the substrate 101. The plurality of top layers 207 may be respectively correspondingly disposed on the plurality of middle layers 205. Top surfaces of the plurality of top layers 207 may be at the same vertical level as the top surface of the substrate 101.

With reference to FIG. 35, a plurality of doped regions may be disposed in the plurality of active regions 105 of the substrate 101. Each of the plurality of doped regions includes a first doped region 301 and second doped regions 303. For each of the plurality of doped regions, the first doped region 301 is disposed between an adjacent pair of the plurality of word lines 201. The second doped regions 303 are respectively disposed between the plurality of isolation structures 103 and the plurality of word lines 201.

With reference to FIG. 35, the plurality of insulating films may be disposed above the substrate 101. The plurality of insulating films may include a first insulating film 801, a second insulating film 803, a third insulating film 805, a fourth insulating film 807, a fifth insulating film 809, a sixth insulating film 811, and a seventh insulating film 813. The first insulating film 801 may be disposed on the substrate 101. The plurality of contacts may be disposed in the first insulating film 801. The plurality of contacts may include a contact 401 and capacitor contacts 403. The contact 401 is disposed on the first doped region 301 and is electrically connected to the first doped region 301. The capacitor contacts 403 are respectively disposed on the second doped regions 303 and are respectively electrically connected to the second doped regions 303. In the embodiment depicted, the contact 401 is formed including tungsten.

With reference to FIG. 35, the second insulating film 803 may be disposed on the first insulating film 801. The plurality of bit line contacts 405 may be disposed in the second insulating film 803. (Only bit line contact is shown in FIG. 35.) The first coverage layer 407 may be disposed in the second insulating film 803 and on a top surface of the contact 401; in other words, the first coverage layer 407 may be disposed between the plurality of bit line contacts 405 and the contact 401. In addition, the first coverage layer 407 may be disposed on and attached to sidewalls of the plurality of bit line contacts 405. The first coverage layer 407 may include tungsten nitride.

With reference to FIG. 35, the third insulating film 805 may be disposed on the second insulating film 803. The plurality of bit lines 409 may be disposed in the third insulating film 805 and on the plurality of bit line contacts 405 and the first coverage layer 407. (Only one bit line 409 is shown in FIG. 35.) The fourth insulating film 807 may be disposed on the third insulating film 805. The plurality of plugs 411 may be disposed to pass through the fourth insulating film 807, the third insulating film 805, and the second insulating film 803. The plurality of plugs 411 may be respectively correspondingly electrically connected to the capacitor contacts 403.

With reference to FIG. 35, the capacitor contact 403 includes a neck portion 403-1 and a head portion 403-2 over the neck portion 403-1, wherein an upper width W1 of the head portion 403-2 is larger than an upper width W2 of the neck portion 403-1. In some embodiments, the upper width W2 of the neck portion 403-1 is substantially the same as a bottom width of the head portion 403-2. In some embodiments, the head portion 403-2 has a curved sidewall 403-3. In some embodiments, the head portion has tapered profile.

With reference to FIG. 35, in some embodiments, a plurality of first spacers 808A are respectively disposed on the protruding portion 411A of the plugs 411. In some embodiments, the first spacer 808A comprises metal silicide and is disposed on a sidewall of the protruding portion 411A. In some embodiments, the width W4 of the first spacer 808A is larger than the width W3 of the capacitor plug 411. In some embodiments, a plurality of second spacers 808B are respectively disposed over the first spacers 808A. In some embodiments, the first spacer 808A comprises polysilicon and is disposed on a sidewall of the protruding portion 411A, and the second spacer 808B comprises metal silicide from the polysilicon of the first spacer 808A. In some embodiments, the protruding portion 411A, the first spacer 808A, and the second spacer 808B form a landing pad 810 over the capacitor contact 403.

With reference to FIG. 35, the fifth insulating film 809 may be disposed on the fourth insulating film 807. The plurality of capacitor structures 501 may be disposed in the fifth insulating film 809. The plurality of capacitor structures 501 may include a plurality of bottom electrodes 505, a capacitor insulating layer 507, and a top electrode 509. The plurality of bottom electrodes 505 may be inwardly disposed in the fifth insulating film 809 and respectively correspondingly electrically connected to the plurality of plugs 816. The capacitor insulating layer 507 may be disposed on the plurality of bottom electrodes 505. The top electrode 509 may be disposed on the capacitor insulating layer 507.

With reference to FIG. 35, the sixth insulating film 811 may be disposed on the fifth insulating film 809. The bottom via 413 may be disposed in the sixth insulating film 811 and electrically connected to the top electrode 509. The bottom via 413 may include tungsten. A seventh insulating film 813 may be disposed on the sixth insulating film 811. The first conductive layer 415 may be disposed in the seventh insulating film 813 and above the bottom via 413. The second coverage layer 417 may be disposed on a top surface of the bottom via 413, and the second coverage layer 417 may be disposed between the bottom via 413 and the first conductive layer 415. In addition, the second coverage layer 417 may be disposed on and attached to sidewalls of the first conductive layer 415. The second coverage layer 417 may include tungsten nitride.

Figure 36:
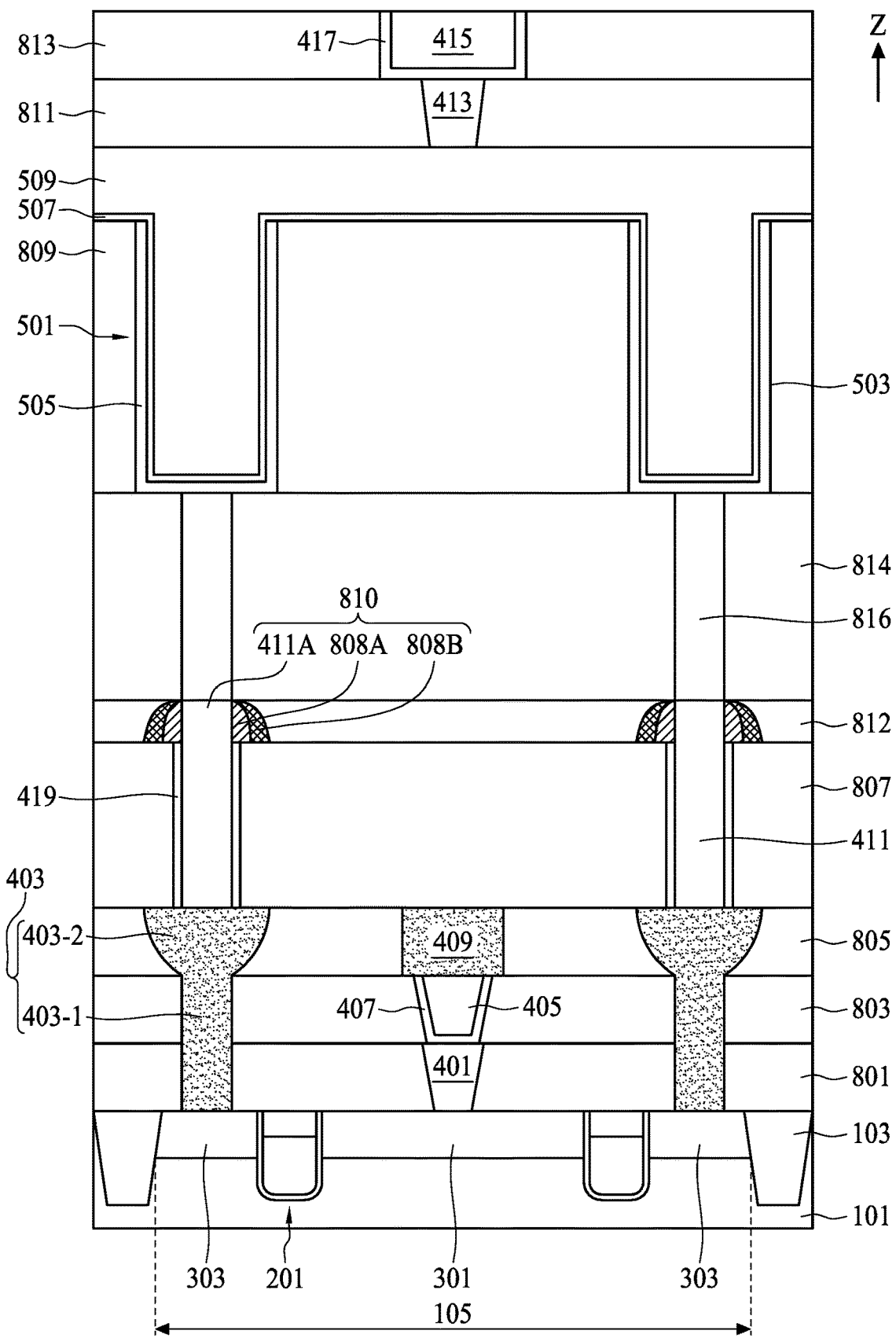
FIGS. 36 to 37 illustrate, in schematic cross-sectional view diagrams, some semiconductor devices in accordance with some embodiments of the present disclosure.
Figure 37:
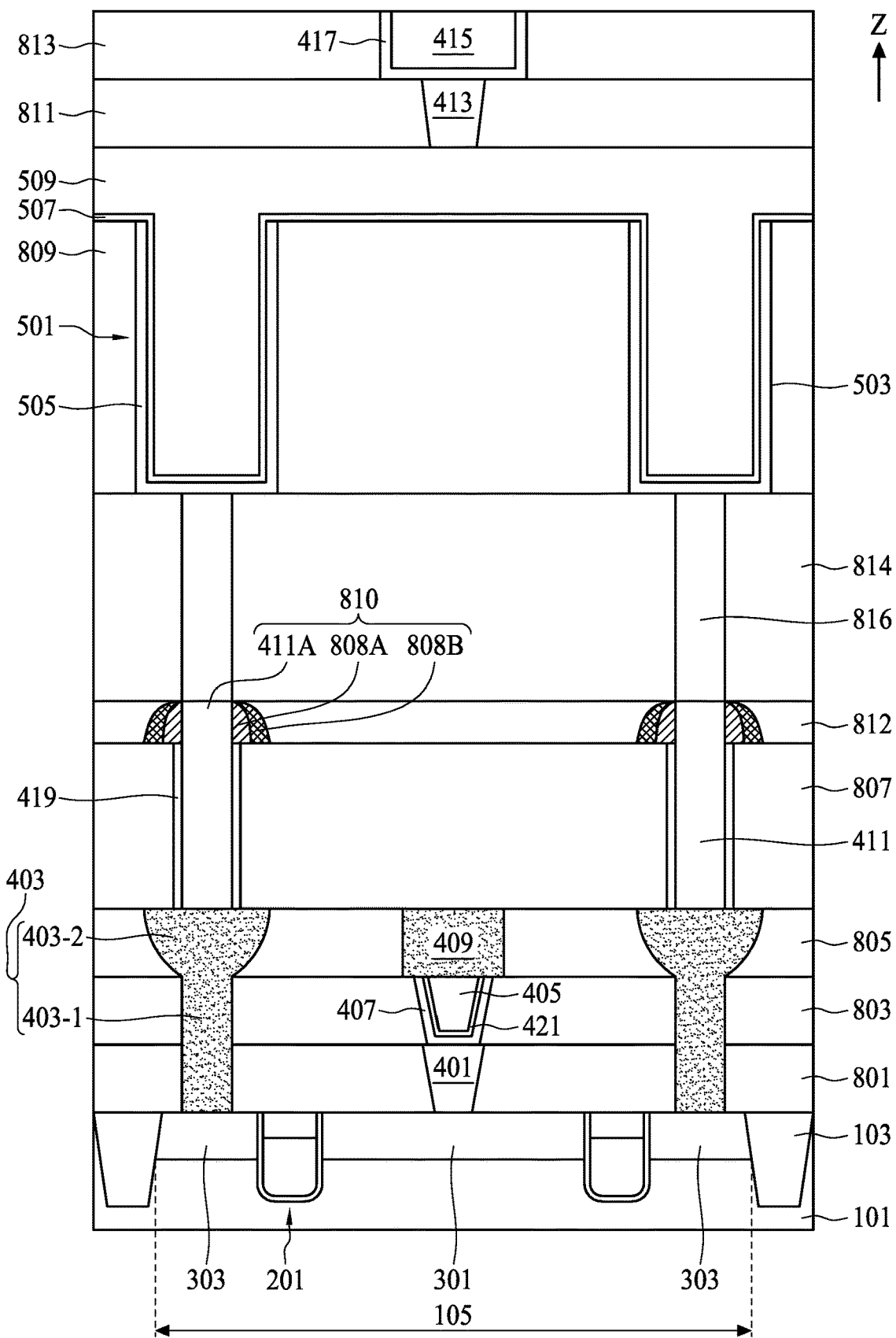

FIGS. 36 and 37 illustrate, in schematic cross-sectional view diagrams, some semiconductor devices in accordance with some embodiments of the present disclosure.

With reference to FIG. 36, the semiconductor device may include a plurality of third coverage layers 419. The plurality of third coverage layers 419 may be respectively correspondingly disposed between the capacitor contacts 403 and the plurality of plugs 411. In other words, the plurality of third coverage layers 419 may be respectively correspondingly disposed on top surfaces of the capacitor contacts 403 formed including tungsten. The plurality of third coverage layers 419 may be respectively correspondingly disposed on and attached to sidewalls of the plurality of plugs 411. The plurality of third coverage layers 419 may include tungsten nitride. In the present embodiment, only the first coverage layer 407, the second coverage layer 417, and the plurality of third coverage layers 419 are disposed on the contact 401, the bottom via 413, and the capacitor contacts 403, respectively; however, other conductive layers or vias may also applicable.

Note that, in the present embodiment, a coverage layer may be regarded as the first coverage layer 407, the second coverage layer 417, or the third coverage layer 419, but is not limited thereto. A conductive feature may be regarded as the contact 401, the second contact 403, or the bottom via 413, but is not limited thereto.

With reference to FIG. 37, the semiconductor device may include a first barrier layer 421. The first barrier layer 421 may be disposed between the first coverage layer 407 and the plurality of bit line contacts 405. The first barrier layer 421 may be formed of, for example, titanium, titanium nitride, titanium-tungsten alloy, tantalum, tantalum nitride, or the combination thereof. The first barrier layer 421 may improve adhesion between the first coverage layer 407 and the plurality of bit line contacts 405.

Due to the landing pad having the first spacer, wherein a width of the first spacer is larger than a width of the capacitor plug, the misalignment between the subsequently formed capacitor structure and the landing pad can be dramatically solved, wherein a width of the first spacer is larger than a width of the capacitor plug.

Due to the capacitor contact having the neck portion and the head portion with a tapered profile, the misalignment between the subsequently formed capacitor structure and the capacitor contact can be dramatically solved. In addition, the coverage layer may reduce formation of defects in the semiconductor device; therefore, the yield of the semiconductor device increases correspondingly.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a plurality of landing pads disposed over the substrate, wherein at least one of the plurality of landing pads comprising a protruding portion of a capacitor plug and a first spacer over the protruding portion, wherein a width of the first spacer is larger than a width of the capacitor plug;
a plurality of capacitor contacts positioned over the substrate, wherein the plurality of landing pads are disposed over the plurality of capacitor contacts, wherein at least one of the plurality of capacitor contacts having a neck portion and a head portion over the neck portion, wherein an upper width of the head portion is larger than an upper width of the neck portion;
a plurality of bit line contacts disposed over the substrate and a plurality of bit lines respectively disposed over the plurality of bit line contacts, wherein at least one of the plurality of bit lines is an undulating stripe extending between two adjacent capacitor contacts of the plurality of capacitor contacts, wherein a top surface of the at least one of the plurality of bit lines and a top surface of the head portion of at least one of the plurality of capacitor contacts are coplanar; and
a plurality of capacitor structures respectively disposed over the plurality of landing pads.

2. The semiconductor device of claim 1, wherein the first spacer comprises metal silicide and is disposed on a sidewall of the protruding portion.

3. The semiconductor device of claim 1, wherein the first spacer comprises polysilicon and is disposed on a sidewall of the protruding portion.

4. The semiconductor device of claim 3, further comprising a second spacer disposed over the first spacer.

5. The semiconductor device of claim 4, wherein the second spacer comprises metal silicide.

6. The semiconductor device of claim 1, wherein the upper width of the head portion is larger than a bottom width of the head portion.

7. The semiconductor device of claim 1, wherein the upper width of the neck portion is the same as a bottom width of the head portion.

8. The semiconductor device of claim 1, wherein the head portion has a curved sidewall.

9. The semiconductor device of claim 1, wherein the head portion has a tapered profile.

* * * * *